(12) United States Patent
Akedo et al.

(10) Patent No.: US 8,125,699 B2
(45) Date of Patent: Feb. 28, 2012

(54) OPTICAL SCANNING DEVICE

(75) Inventors: Jun Akedo, Tsukuba (JP); Jaehyuk Park, Tsukuba (JP); Harumichi Sato, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 398 days.

(21) Appl. No.: 12/443,221

(22) PCT Filed: Sep. 26, 2007

(86) PCT No.: PCT/JP2007/068674
§ 371 (c)(1),
(2), (4) Date: Mar. 27, 2009

(87) PCT Pub. No.: WO2008/041585
PCT Pub. Date: Apr. 10, 2008

(65) Prior Publication Data
US 2010/0014142 A1    Jan. 21, 2010

(30) Foreign Application Priority Data

Sep. 27, 2006 (JP) .................................. 2006-261678

(51) Int. Cl.
G02B 26/08 (2006.01)

(52) U.S. Cl. .................................. 359/199.1; 359/224.1

(58) Field of Classification Search .... 359/198.1–199.4, 359/200.8, 221.2, 224.1, 200.6, 200.7
See application file for complete search history.

(56) References Cited

U.S. PATENT DOCUMENTS

| 2,920,529 | A | * | 1/1960 | Blythe ........................ 359/224.1 |
| 5,245,463 | A | | 9/1993 | Goto |
| 5,745,278 | A | * | 4/1998 | La Fiandra .................. 359/224.1 |
| 5,959,760 | A | | 9/1999 | Yamada et al. |
| 6,729,545 | B2 | * | 5/2004 | Li et al. ..................... 235/462.43 |
| 7,031,041 | B2 | * | 4/2006 | Mi et al. ..................... 359/224.1 |
| 7,593,029 | B2 | * | 9/2009 | Satoh et al. .................... 347/243 |

(Continued)

FOREIGN PATENT DOCUMENTS

JP    04-095917    3/1992

(Continued)

OTHER PUBLICATIONS

Jae-Hyuk Park et al., "Practical High-Speed Metal-Based Optical Micro scanning Devices with Low Production Cost", Micro Electro Mechanical System, Jan. 2006, pp. 730-733.

(Continued)

*Primary Examiner* — Frank Font
(74) *Attorney, Agent, or Firm* — Greenblum & Bernstein, P.L.C.

(57) ABSTRACT

An optical scanning device of the invention includes: a substrate; a torsion bar portion which is connected to the substrate; a mirror portion which is supported by the torsion bar portion; a drive source which causes the substrate to oscillate; and a light source which projects light onto the mirror portion, where the mirror portion resonates and vibrates in accordance with a vibration imparted to the substrate by the drive source, a direction of reflection light from the light projected onto the mirror portion from the light source changes in accordance with the vibration of the mirror portion, the drive source is provided on a portion of the substrate at a distance from a connected portion where the substrate is connected to the torsion bar portion, and a substrate shape control device which controls the shape of the substrate itself is provided on the substrate.

15 Claims, 23 Drawing Sheets

U.S. PATENT DOCUMENTS

| | | | |
|---|---|---|---|
| 7,605,966 B2 * | 10/2009 | Tani et al. | 359/224.1 |
| 2005/0078169 A1 * | 4/2005 | Tumer | 347/260 |
| 2005/0254111 A1 * | 11/2005 | Griffith et al. | 359/224 |
| 2006/0245023 A1 * | 11/2006 | Akedo et al. | 359/223 |
| 2007/0064293 A1 * | 3/2007 | Turner et al. | 359/224 |
| 2007/0171500 A1 * | 7/2007 | Jeong et al. | 359/224 |

FOREIGN PATENT DOCUMENTS

| | | |
|---|---|---|
| JP | 07-065098 | 3/1995 |
| JP | 09-197334 | 7/1997 |
| JP | 10-104543 | 4/1998 |
| JP | 10-197819 | 7/1998 |
| JP | 11-52278 | 2/1999 |
| JP | 2000-292735 | 10/2000 |
| JP | 2001-4952 | 1/2001 |
| JP | 2004-258158 | 9/2004 |

OTHER PUBLICATIONS

English language Abstract of JP 2001-4952, Jan. 12, 2001.
English language Abstract of JP 2004-258158, Sep. 16, 2004.
English language Abstract of JP 2000-292735, Oct. 20, 2000.
English language Abstract of JP 11-52278, Feb. 26, 1999.
English language Abstract of JP 07-065098, Mar. 10, 1995.
English language Abstract of JP 04-095917, Mar. 27, 1992.
English language Abstract of JP 10-197819, Jul. 31, 1998.
English language Abstract of JP 09-197334, Jul. 31, 1997.
English language Abstract of JP 10-104543, Apr. 24, 1998.
U.S. Appl. No. 12/444,922 to Akedo et al. (U.S. National Stage of PCT/JP2007/068699), which has an international filed of Sep. 26, 2007.

* cited by examiner

FIG. 1
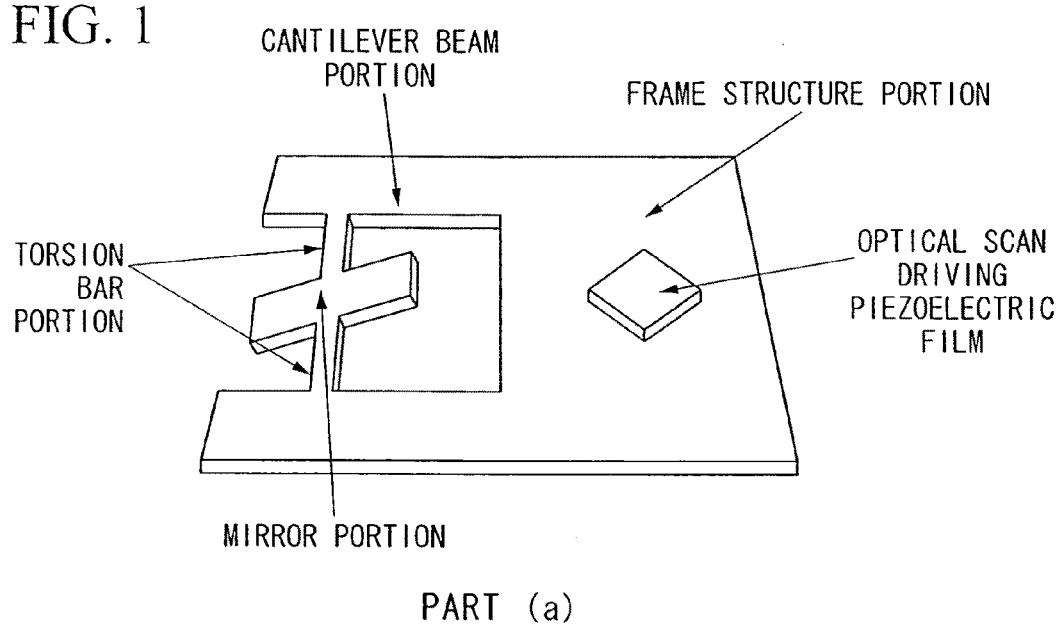
PART (a)
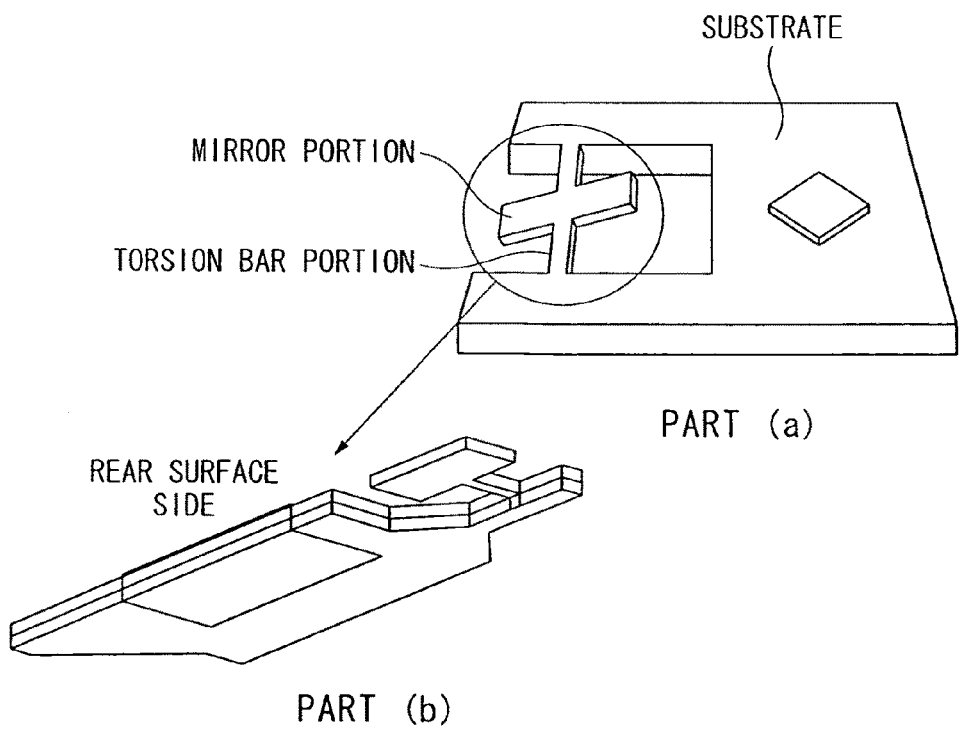
PART (a)
PART (b)

a TORSIONAL RESONANCE OF MIRROR PORTION (fm)
b DIVIDED RESONANCE VIBRATION OF FRAME PORTION (fb)

PART (a)

PART (b)

FIG. 16
PART (a)
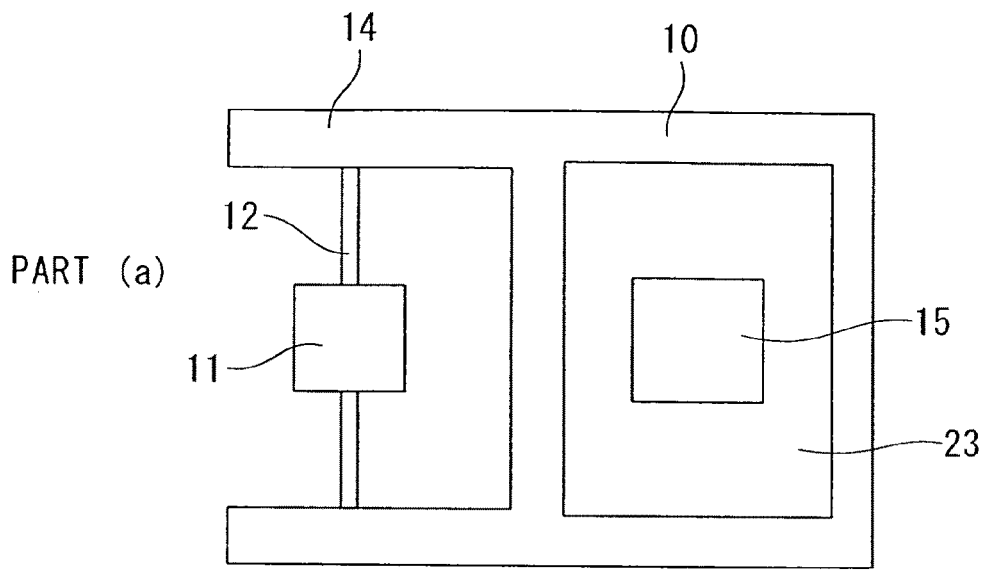
PART (b)
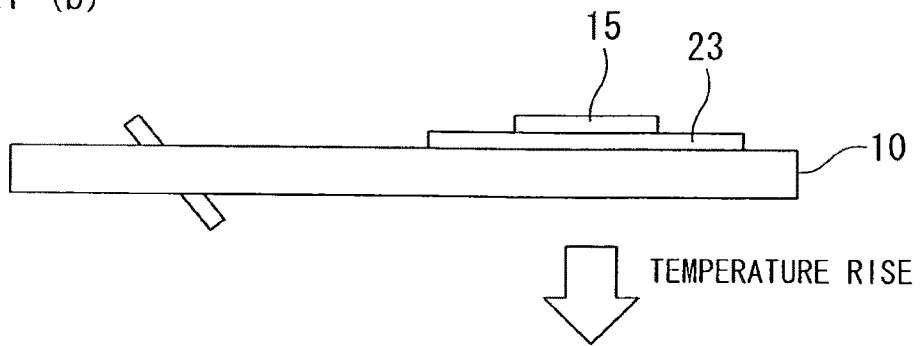
TEMPERATURE RISE
PART (c)
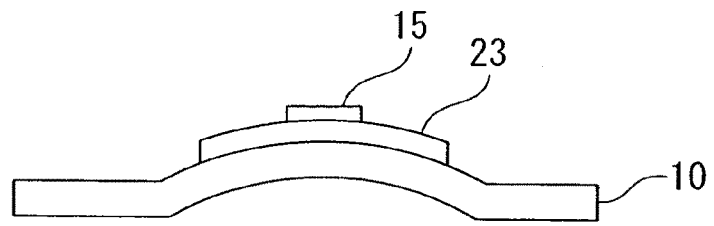

FIG. 17
PART (a)
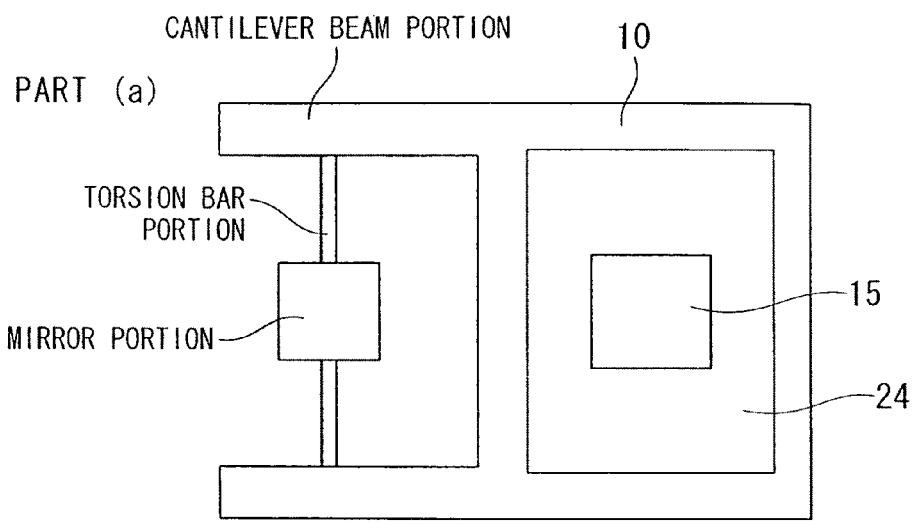
PART (b)
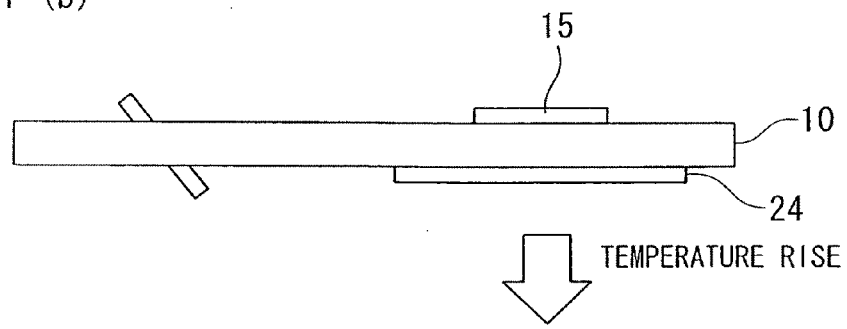
TEMPERATURE RISE
PART (c)
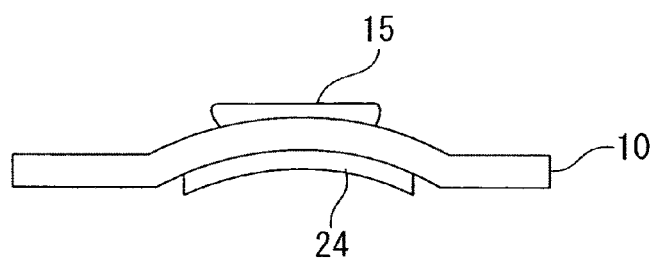

OPTICAL SCANNING DEVICE

BACKGROUND OF THE INVENTION

1. Field of the Invention

Priority is claimed on Japanese Patent Application No. 2006-261678, filed Sep. 27, 2006, the contents of which are incorporated herein by reference.

The present invention relates to an optical scanner which performs scans by the scanning of an optical beam, and, in particular, to an optical scanning device having a structure in which a micro mirror which is supported by torsion bars is made to oscillate so as to cause the direction of an optical beam to change.

2. Background Art

In recent years, optical scanners which scan optical beams of laser light or the like have been used as optical instruments such as bar code readers, laser printers, and head mounted displays, or as the optical capturing devices of input devices such as infrared cameras and the like. Optical scanners having a structure in which a micro mirror obtained via silicon micromachining technology is oscillated have been proposed for this type of optical scanner. For example, the structure described in Japanese Unexamined Patent Application, First Publication No. H07-65098 (Patent document 1) is known (referred to below as 'Conventional technology 1'). As shown in FIG. 21, this optical scanner irradiates light which is emitted from a light source 100 and reflected by a mirror section 101 onto a detection object 102, and then vibrates the mirror section 101 so that the light is scanned in a predetermined direction of a detected object 102, and is provided with two mutually parallel drive sources 103 and 103 which are formed as cantilevered beams with one end respectively thereof formed as a fixed end and which perform bending operations, a linking component 104 which links together the free end sides of the two drive sources 103 and 103, a torsional deformation component 105 which extends from a center portion of the linking component 104, and the mirror section 101 which is provided on this torsional deformation component 105. The center of gravity of the mirror section 101 is made to sit on the torsion center axis of the torsional deformation component. If the two drive sources 103 and 103 are driven, for example, by a bimorph structure on which a piezoelectric material has been adhered, and are vibrated in antiphase, then torsional vibration is induced in the torsional deformation component 105, and the two drive sources are driven at the resonance frequency of the torsional deformation component 105. As a result, it is possible to vibrate the mirror section over a sizable amplitude.

Moreover, as shown in FIG. 22, the scanner described in Japanese Unexamined Patent Application, First Publication No. H04-95917 (Patent document 2, referred to below as 'Conventional technology 2') is a scanner in which a mirror surface 11 is formed by a surface of a vibrator 110 having two elastic deformation modes, namely, a bending deformation mode and a torsional deformation mode, and in which this vibrator is vibrated at the respective resonance frequencies of the two modes. Optical beams irradiated towards the mirror surface of the vibrator are reflected by that mirror surface so that the light is scanned in two directions. If the vibrator is vibrated in a single mode, then this scanner becomes a one-dimensional scanning optical scanner.

Moreover, as an optical scanner in which a micro mirror obtained by means of silicon micromachining technology is oscillated, the structure described in Japanese Unexamined Patent Application, First Publication No. H10-197819 (Patent document 3) is known (referred to below as 'Conventional technology 3').

As shown in FIG. 23, this optical scanner is provided with a plate-shaped micro mirror 121 which is used to reflect light, a pair of rotation supporting bodies 122 which are positioned on a straight line and support both sides of the micro mirror out 121, a frame portion 123 to which the pair of rotation supporting bodies 122 are connected and which surrounds the periphery of the mirror 1, and a piezoelectric element 124 which applies translational motion to the frame portion 123. In addition, this optical scanner is structured such that the center of gravity of the mirror 121 is located at a position outside the straight line connecting together the pair of rotation supporting bodies 122.

When voltage is applied to the piezoelectric element 124, the piezoelectric element 124 is made to expand and contract, so as to vibrate in the Z axial direction. This vibration is transmitted to the frame portion 123. When the micro mirror up 121 is made to undergo relative motion relative to the driven frame portion 123 and the vibration component in the Z axial direction is transmitted to the micro mirror 121, because the micro mirror out 121 has a left-right asymmetrical mass component relative to the axis formed by the X axis rotation supporting bodies 122, rotational moment is generated in the micro mirror 121 centered on the X axis rotation supporting bodies 122. In this manner, the translational motion which has been applied to the frame portion 123 by the piezoelectric element 124 is transformed into rotational motion centering on the X axis rotation supporting bodies 122 of the micro mirror 121.

Moreover, as shown in FIG. 24, the optical scanner described in Japanese Unexamined Patent Application, First Publication No. H09-197334 (Patent document 4, referred to below as 'Conventional technology 4') has a vibrating portion 131 which has a mirror surface on one surface thereof, a fixed portion 132 to which vibration is applied, and an elastic deformation portion 133 which links the vibrating portion 131 to the fixed portion 132 and which elastically deforms, and a spring constant variable element 134 which adjusts resonance characteristics is provided in the elastic deformation portion 133.

An electrical resistance element which is a heat-generating source or a piezoelectric element which is a distortion generating source is used for this spring constant variable element 134. The spring constant of the elastic deformation portion 133 is changed either by a deformation or changes in the temperature of the elastic deformation portion 133, so that it is possible to adjust the resonance characteristics of the vibration.

Moreover, as shown in FIG. 25, an optical scanning device is also described in Japanese Unexamined Patent Application, First Publication No. H10-104543 (Patent document 5, referred to below as 'Conventional technology 5'). In this optical scanning device, beam portions 143 and 143 extend in mutually opposite directions from both sides of a movable portion 142 in a vibrator 141, and are connected to two arm portions 144 and 144 of a fixed portion 146. Piezoelectric thin films 145 and 145 are provided respectively on the arm portions 144 and 144 of the fixed portion 146, and these piezoelectric thin films 145 and 145 are driven by the same signal which includes higher order vibration frequencies.

In the above-described optical scanners of Conventional technologies 1, 2, 3, and 4, the properties (i.e., the optical scan angle, the optical scanning speed, and the optical scan trajectory and the like) of optical scanners which use this type of resonance vibration of a vibrator are hugely dependent on the resonance characteristics of the vibrator. Of the resonance characteristics of a vibrator, the resonance frequency, phase, and amplitude, in particular, have a considerable effect on the optical scan angle and the trajectory of the optical scan line of the optical beams emitted from the optical scanner.

If, for example, the spring constant of the elastic deformation portion (i.e., the torsion bar) in Conventional technology 4 is taken as k, and the moment around the rotation axis (i.e., the Y axis or the Z axis) is taken as I, then the resonance frequency f in a vibrator 1 can be expressed by the following formula.

$$f = \frac{1}{2\pi}\sqrt{\frac{k}{I}} \qquad (1)$$

The spring constant in the bending deformation mode (in a θB direction) of the elastic deformation portion is taken as kB, while the spring constant in the torsion deformation mode (in a θT direction) is taken as kT. If the spring constant k in Formula (1) is replaced by these spring constants kB and kT, then Formula (1) shows the resonance frequency fB in the bending deformation mode, and shows the resonance frequency fT in the torsion deformation mode, and the spring constant kB in the bending deformation mode is expressed by the following formula.

$$K_B = \frac{Ewt^3}{4L} \qquad (2)$$

Here, E is Young's modulus, w is the width (i.e., the length in the Y direction) of the elastic deformation potion, t is the thickness (i.e., the length in the X direction) of the elastic deformation portion, and L is the length (i.e., the length in the Z direction of the elastic deformation potion.

The spring constant kT in the torsion deformation mode is expressed by the following formula.

$$K_T = \frac{G\beta wt^3}{12L} \ (t < w) \qquad (3)$$

Here, G is the modulus of transverse elasticity, and β is a coefficient relating to the shape of the cross section. In Formula (3), more typically, w represents the length of a long side of the cross section of the elastic deformation portion, and t represents the length of a short side of the same cross section.

It is understood from Formula (1) that, as a result of the spring constant k changing, the resonance frequency of the vibrator is changed. Moreover, the Young's modulus E in Formula (2) and the modulus of transverse elasticity G in Formula (3) are also known as material constants, and because the interatomic force and shape of the elastic deformation portion are changed by thermal expansion in accordance with changes in the external temperature environment, these material constants also change.

Accordingly, if the temperature of the operating environment of an optical scanner changes, or if the temperature of the optical scanner itself rises because of heat generated from a drive source thereof, the resonance frequency also changes. Because of this, if the frequency of the drive source is fixed, the scan angle of the mirror becomes smaller and it is not possible for it to be kept constant. The result of this has been that it has been difficult for these optical scanners to be used in display devices or precision measuring instruments which are used in real environments because more the value Q (quality factor value, Q=ω0 m/r, m: mass, r: resistance) of the mechanical resonance system of the optical scanner is enlarged in order to lower the drive voltage of the optical scanner or to increase the scan angle of the mirror, then the more the change in the mirror scan angle due to the environmental temperature becomes sharper and larger.

Moreover, in a process (for example, silicon etching, metal etching, and the like) to manufacture a vibrator in which a vibrator is manufactured by processing a normal silicon substrate and metal, irregularities occur easily in the shape of the vibrator during processing. Irregularities in the shape of the vibrator cause irregularities in the resonance characteristics of the vibrator.

Adjusting the resonance characteristics of a vibrator by adding weight to a specific position on the vibrator, or by forming comb teeth in advance on portions of the vibrator and then removing these comb teeth one by one may be considered, however, there are problems in that irregularities easily occur in the positions where weight is attached, a microfabrication is required in order to form the comb teeth, or the like. It is also easy for deformation and breakage to occur in the vibrator as a result of these adjustments, and it becomes difficult for adjustments of the resonance characteristics to be performed repeatedly. Above all, when adding weight or removing comb teeth, the amount of adjustment is too large to allow precise adjustments to be made either easily or at all.

Because these types of problems exist, in order to keep the optical scanning performance (i.e., the resonance frequency, the mirror scan angle, and the phase) of an optical scanner device uniform in the face of changes in the surrounding environmental temperature and in the face of irregularities in manufacturing, it is necessary to correct the circuit constant in the optical scanner drive circuit and photoreceptor signal processing circuit. The increased costs brought about by these adjustments are a big problem in practical applications.

In the conventionally known prior technologies 1, 2, 3, and 4, the resonance frequency f of the torsional vibration of a vibrator whose mirror portion is supported by a torsion bar is determined by the weight of the mirror portion (in this case, the rotational moment I of the mirror portion) and the length L of the torsion bar, and by the spring constant Kt in the torsion direction of the torsion bar which are expressed in the above-described Formulas (1) and (3). In contrast to this, as shown in PART (a) of FIG. 1, the resonance frequency of the torsional vibration of the mirror portion of the optical scanning device in which plate waves or vibration are used and which is the subject of the invention are not determined solely by the weight of the mirror portion (in this case, the rotational moment I of the mirror portion) and the length L of the torsion bar, but are also affected considerably by the shape and size as well as the thickness of the substrate (i.e., the frame structural portion) itself by which the mirror portion and portion bar are linked and supported, and by the spring constant Kf. FIGS. 1 and 2 illustrate this difference by means of a simulation based on the finite element method. The optical scanning devices shown in FIGS. 1 (*a*) and 1 (*b*) PART (a) and PART (b) of FIG. 1 both have mirror portions and torsion bars having exactly the same shape and mechanical characteristics, however, in the optical scanning device shown in PART (b) of FIG. 1, the thickness of the substrate portion (i.e., the frame structural portion) supporting the cantilevers which support the mirror portion and torsion bars is twice that of the example shown in PART (a) of FIG. 1, so that the spring constant Kf (i.e., the rigidity) thereof is increased.

A comparison of the resonance frequencies f and scan angles θ of these two is shown in FIG. 2. The above-described resonance frequencies have considerably shifted to the high frequency side.

Accordingly, by changing not only the spring constant Kt in the torsion direction of the torsion bars and the shape (i.e., the cross-sectional configuration and the length L) of the torsion bars themselves, but by also changing the spring constant Kf and the shape of the substrate (i.e. the frame structural portion) itself by which the mirror portion and torsion bars are joined and supported, it is possible to change the resonance frequency f of the torsional vibration of a vibrator whose mirror portion is supported by torsion bars.

Conversely, if the surrounding environmental temperature of the optical scanning device is changed, then the spring constant Kt in the torsion direction of the torsion bars and the shape (i.e., the cross-sectional configuration and the length L) of the torsion bars themselves, or the spring constant Kf and the shape of the substrate (i.e. the frame structural portion) itself by which the mirror portion and torsion bars are joined and supported are also changed, and the resonance frequency f of the torsional vibration of a vibrator whose mirror portion is supported by torsion bars is changed.

Moreover, the optical scanning device of the above-described Conventional technology 5 has the drawback that a large torsion angle cannot be formed in the movable portion 142.

Namely, if a piezoelectric film is formed in the two narrow cantilever beam portions which support the two torsion bars protruding from the frame portion, then the rigidity of this portion increases and vibration which is induced in the piezoelectric film is not transmitted efficiently to the torsion bars. As a result, the torsion vibration of the mirror is reduced. Moreover, unless the vibration characteristics of the vibration source portion formed by the two cantilever beam portions and the piezoelectric film which is formed thereon are matched precisely, then the vibration amplitude of the torsional vibration of the mirror becomes suppressed and, at the same time as this, torsion modes other than torsional vibration are accumulated so that accurate laser beam scanning cannot be achieved. Furthermore, in order to increase the drive power for the mirror by increasing the surface area of the piezoelectric film portion, it is necessary to increase the width of the cantilever beam portions. Because of this, an unnecessary two-dimensional vibration mode is generated in the same cantilever beam portion, so that at the same time as the vibration amplitude of the torsional vibration of the mirror is restricted, a vibration mode other than the torsional vibration is superimposed thereon. As a result, the problem arises that it is not possible to achieve accurate laser beam scanning. Moreover, because the width of the cantilever beams is restricted to a narrow width, the formation of the top portion electrodes which are used to drive the piezoelectric film formed on this portion is made more difficult because of the narrow width, so that problems arise such as the yield during production being greatly affected.

FIG. 26 shows the same case as that of the Conventional technology 5, and shows a structure in which a piezoelectric film is formed on two narrow-width cantilever beam portions which support two torsion bars which protrude from a frame portion. The drive efficiency of the mirror portion scan angle was checked by a simulation calculation. The surface where Y=0 was taken as a plane of symmetry, and half of this was used as a model.

FIG. 27 shows the torsion angle of a mirror having a structure in which a piezoelectric film is formed on two narrow-width cantilever beam portions which support two torsion bars which protrude from the frame portion shown in FIG. 23. The drive voltage was set at 1 V, while the characteristics of a PZT-5A which are typical parameters were used for the electrical characteristics of the piezoelectric body, while SUS 304 characteristics were used for the material of the scanner frame main body. The torsion angle of the mirror portion was small at only 0.63°.

SUMMARY OF THE INVENTION

The invention was conceived in consideration of the fact that the above-described problems are not solved simply by the spring constant Kt in the torsional direction of the above-described torsion bar portion, or by the shape of the torsion bar portion itself (i.e., the cross-sectional configuration and the length L thereof), and it is a first object thereof to provide an optical scanning device having functions and a structure which, by changing the spring constant Kf and shape of an actual substrate (i.e., a frame structural portion) itself by which the mirror portion and torsion bar portions are linked and supported in response to changes in the surrounding environmental temperature or to irregularities arising during production, make it possible to keep constant a resonance frequency f of the torsional vibration of a vibrator in which the above-described mirror portion is supported by a torsion bar.

Moreover, it is a second object of the invention to provide an optical scanning device in which, as a result of the shape of the cantilever beam portions which support the torsion bars being adjusted and as a result of the mounting position of the torsion bars being adjusted, the scan angle is made stable over a wider temperature range.

Moreover, it is a third object of the invention to provide an optical scanning device in which, as a result of the cross-sectional configuration of the torsion bars being adjusted, the scan angle is made stable over a wider temperature range.

Moreover, it is a fourth object of the invention to provide an optical scanning device in which torsional vibration can be generated efficiently in a mirror portion.

A description will now be given of the fundamental elements of the principle and apparatus for compensating for temperature changes and production irregularities of the invention in order to achieve the above-described objects with reference made to the drawings.

Firstly, the basic structure of the optical scanning device which is the subject of the invention is shown in FIG. 3.

In FIG. 3, by etching or by press working a plate material a substrate 10 is cut out so as to leave a mirror portion 11 and torsion bar portions 12 remaining. The mirror portion 11 is supported from both sides by the torsion bar portions 12 and 12 which are joined to the substrate 10. Outer side ends of the torsion bar portions 12 and 12 are supported respectively by cantilever beam portions 14.

In addition, one end of the substrate 10 is supported in a cantilever form by a supporting component 13.

In the present specification, the term 'substrate 10' refers to a frame structural portion of the apparatus excluding the mirror portion 11 and the torsion bar portions 12, but including the cantilever beam portions 14, while the term 'substrate main body' refers to portions of the substrate excluding the cantilever beam portions 14 (hereinafter, the substrate 10 may be referred to as a frame structural portion). The portion of the substrate 10 which excludes the cantilever beam portions 14 is referred to as the substrate main body.

A piezoelectric film 15 which is used to drive an optical scan is formed on a portion of the main body portion of the substrate 10 away from the linking portion between the substrate 10 and torsion bar portions 12. This piezoelectric film 15 is formed using a thin-film formation method such as an aerosol deposition method (may be referred to below on occasion as an 'AD method'), a sputtering method, or a sol-gel method, or maybe formed by adhering a bulk piezoelectric thin plate material thereon. When voltage is applied from a power source 16 to a top portion electrode 17 on the optical scan driving piezoelectric film 15 and to the substrate 10 which serves as a bottom portion electrode, the optical scan driving piezoelectric film 15 vibrates in piezoelectric oscillation, and a plate wave or vibration is induced in the substrate 10. Using this, torsional vibration is generated in the mirror portion 11. As a result, it is possible to generate torsional vibration efficiently in the mirror portion 11 using a simple structure.

In this case, the optical scan driving piezoelectric film 15 forms a drive source to cause the substrate 10 to vibrate.

If optical beams are irradiated from a light source 18 onto the mirror portion 11 while voltage is being applied to the optical scan driving piezoelectric film 15 which serves as a drive source, then because the mirror portion 11 vibrates, light which is reflected by the mirror portion 11 vibrates at a uniform torsion angle.

As a specific structure intended to compensate for temperature changes and irregularities occurring during production, as shown in FIGS. 4A and 4B, a stress-applying piezoelectric film 20 which is able to apply deformation force in order to adjust the above-described resonance frequency f is formed on the substrate 10 which joins together and supports the mirror portion 11 and torsion bar portions 12. If an electrical control signal is applied in order to correct changes in the above-described resonance frequency f which are caused by the separately detected surrounding environmental temperature or production irregularities, then the substrate 10 which joins together and supports the mirror portion 11 and torsion bar portions 12 is deformed by generated force from the stress-applying piezoelectric film 20, and the spring constant and shape of the substrate 10 which joins together and supports the mirror portion 11 and torsion bar portions 12 also change. Because of this, the resonance frequency f is adjusted and corrected, so that it is possible to perform control such that changes in the resonance frequency f which are caused by changes in the surrounding environmental temperature or production irregularities are eliminated, and the resonance frequency f remains constant.

In the present specification, apparatuses which change the spring constant and shape of the actual substrate 10 itself are collectively referred to as a substrate shape control apparatus.

Moreover, as a method for applying deformation force for adjusting the resonance frequency f to the substrate 10 which links together and supports the mirror portion 11 and the torsion bar portions 12, it is possible to form the substrate 10 from a magnetic material or to form a magnetic material on top of the substrate 10. By then applying an external magnetic field, deformation force for adjusting the resonance frequency f is induced, and if the externally applied magnetic field is adjusted by means of an electrical control signal such that changes in the above-described resonance frequency f which are caused by the separately detected surrounding environmental temperature or production irregularities are corrected, then the substrate 10 which links together and supports the mirror portion 11 and the torsion bar portions 12 becomes deformed, and the spring constant and shape of the substrate 10 which joins together and supports the mirror portion 11 and torsion bar portions 12 are adjusted and corrected. It is thus possible to perform control such that changes in the resonance frequency f which are caused by changes in the surrounding environmental temperature or production irregularities are eliminated, and the resonance frequency f remains constant.

Moreover, as a method for applying deformation force for adjusting the resonance frequency f to the substrate 10 which links together and supports the mirror portion 11 and the torsion bar portions 12, it is possible to form a shape memory alloy or a material having a different coefficient of thermal expansion on the substrate 10 which responds to the surrounding environmental temperature and applies deformation force so as to correct any changes in the resonance frequency f. If this method is employed, then the substrate 10 which links together and supports the mirror portion 11 and the torsion bar portions 12 becomes deformed in accordance with changes in temperature, and the spring constant of the substrate 10 which joins together and supports the mirror portion 11 and torsion bar portions 12 is adjusted automatically. Accordingly, control using the above-described electrical control signal is not performed, and it is furthermore not necessary to use sensors for detecting changes in the surrounding environmental temperature or electronic control circuits, so that it is possible to perform control using an extremely simple structure such that changes in the resonance frequency f which are caused by variations in the surrounding environmental temperature are eliminated, and the resonance frequency f remains constant. Moreover, if a shape memory alloy is used for the aforementioned stress-applying component, it is possible to more easily increase the deformation of the substrate 10 compared with when other methods are used. Accordingly, the frequency adjustment range can be increased which is more effective.

Moreover, in the invention, in consideration of the fact that the above-described problems are not solved simply by the spring constant Kt in the torsional direction of the torsion bar portions 12, or by the shape of the torsion bar portions 12 themselves (i.e., the cross-sectional configuration and the length L thereof), means are provided to change the spring constant Kf and shape of the actual substrate 10 itself by which the mirror portion 11 and torsion bar portions 12 are linked and supported in response to changes in the surrounding environmental temperature or to irregularities arising during production, however, it is also possible to implement these same means not only in the substrate 10 itself, but also in the torsion bar portions as well.

Moreover, as shown in FIG. 6, in order to achieve the above-described second object, in the invention, a width Lh of the cantilever beam portions 14 which support the torsion bar portions 12 is set to be less than or equal to ⅙ a width Lw of the substrate 10, so that temperature compensation can be performed easily, and stability of the scan angle is achieved over a wider temperature range.

Moreover, as shown in FIG. 8, in order to achieve the above-described second object, in the invention, the length between the connection portions where the cantilever beam portions 14 which support the torsion bar portions 12 connect to the torsion bar portions 12 and the open end portion is made shorter than the length between the connection portions where the cantilever beam portions 14 connect to the torsion bar portions 12 and the base ends of the cantilever beam portions 14, so that temperature compensation can be performed easily, and stability of the scan angle is achieved over a wider temperature range.

Moreover, as shown in FIG. 7, in order to achieve the above-described third object, in the invention, a ratio (w/t) between the thickness t and the width w of a cross section of the torsion bar portions 12 is made less than or equal to 1.5, so that temperature compensation can be performed easily, and stability of the scan angle is achieved over a wider temperature range.

Moreover, in order to achieve the above-described fourth object, by lowering the rigidity of the two cantilever beam portions and efficiently inducing mirror torsional vibration by forming a single piezoelectric film (i.e., body) as a vibration source in the frame portion, and at the same time as this, by only providing a single vibration source to drive the mirror, the invention solves the above-described problem of the creation of an unnecessary vibration mode as well as the problem of a consequent reduction in amplitude which are caused by a lack of uniformity in the vibration source. Moreover, by separating the piezoelectric film formation portion which forms the vibration source from the mirror torsional vibration portions which are formed from the mirror portion and the torsion bar portions which support the mirror portion by means of the two cantilever beam portions, the surface area of the piezoelectric film forming the drive source can be set freely irrespective of the width of the cantilever beam portions, and it becomes possible to apply a large drive force more efficiently to the mirror torsional vibration portions. Furthermore, it is also easy to form the electrodes for driving the piezoelectric film, so that it becomes possible to improve the yield in industrial production.

FIG. 9 is a plan view showing an optical scanning apparatus according to the invention which is structured such that one piezoelectric film 15 forming the drive source is provided on the substrate 10, wherein the surface where Y=0 is taken as a plane of symmetry, and only half of this is used as a model.

The dimensions of the mirror portion 11 and the dimensions of the torsion bar portions 12, the mounting position where the torsion bar portions 12 are mounted on the mirror portion 11 (i.e., the position of the center of gravity of the mirror portion 11), the shape of the substrate 10 as well as the method which is used to support it, and also the thickness and the value of the total surface area of the piezoelectric film 15 which all provide the basic structure of the optical scanning apparatus are made the same. This optical scanning apparatus only differs in the position where the piezoelectric film is formed.

FIG. 10 shows the torsion angle of the mirror portion 11 of the apparatus shown in FIG. 9. The drive voltage was set at 1 V, while the characteristics of a PZT-5A which are typical parameters were used for the electrical characteristics of the piezoelectric body, while SUS 304 characteristics were used for the material of the scanner frame main body. Basically, the resonance frequency of the invention shown in FIG. 5 is substantially the same as in Conventional technology 4 shown in PART (a), PART (b) and PART (c) of FIG. 16, however, while the torsion angle of the mirror portion 11 was only 0.63° in Conventional technology 4, in the structure of the invention shown in FIG. 5, it was confirmed to have an approximately 4.3 times greater torsion, namely, the torsion angle was 2.69° (80.7° at a conversion of 30V).

It is also possible to position a plurality of vibration sources on a substrate in order to increase the mirror scanning amplitude, however, in this case, because of irregularities in the mounting state due to the characteristics of the vibration sources or the mounting positions, or to the adhesion or film formation, it becomes easy for two-dimensional vibration which is asymmetrical relative to the axis of symmetry in a perpendicular direction relative to the torsion bars supporting the mirror portion to be induced in the substrate, which results in a deterioration in the scanning accuracy of the optical beams due to the torsional vibration of the mirror portion. In contrast to this, in the invention, torsional vibration is induced efficiently in the mirror portion even though there is only one vibration source, and it is possible to largely reduce scan jitter in the optical beams, and suppress product irregularities.

As shown in FIG. 3 of the invention, in order to transmit vibration energy generated at a position separated from the mirror portion 11 of the as energy which efficiently creates torsional vibration in the mirror portion 11, it is necessary to considerably set the resonance frequency (fm) of the mirror portion 11 which is mainly determined by the mass of the mirror portion 11 and by the spring constant of the torsion bars 12 away from the resonance frequency (fb) which includes the division oscillation mode of the frame portion itself. When the piezoelectric film 15 of the optical scanning device is driven so as to match the resonance frequency (fm) of the torsional vibration of the mirror portion 11, then if a resonance mode is also induced in the substrate 10, the vibration energy generated by the vibration source becomes distributed between torsional vibration of the mirror portion 11 and two-dimensional division vibration of the substrate 10 due to the law of conservation of energy. Accordingly, the amplitude (i.e., the torsion angle) of the torsional vibration of the mirror portion 11 becomes smaller by the amount of vibration energy from the drive source which is consumed by the two-dimensional division vibration of the substrate 10, so that it becomes impossible to efficiently drive the optical scanning device. Moreover, if unnecessary two-dimensional division vibration is induced in the substrate 10, then there are cases in which a vibration mode other than pure torsional vibration which has the torsional bar portions 12 as its axis of rotation becomes superimposed on the mirror portion 11 position at the distal end of the substrate 10, so that it becomes impossible to achieve an optical scan having a high level of accuracy in the rectilinear scan performance thereof. In contrast to this, as shown in FIG. 7, the invention is designed such that the torsional resonance frequency a (fm (n): n=0, 1, 2, . . . ) which includes elements up to the higher orders induced in the mirror portion does not overlap with the torsional resonance frequency b (fb (n): n=0, 1, 2, . . . ) which includes elements up to the higher orders induced in the substrate 10.

The optical scan apparatus of the invention has a basic structure in which the thin plate-shaped substrate 10 shown in FIG. 3 is cantilever supported by a supporting component 13 on the opposite side from the mirror portion 11. Because of this, if a vertical disturbance vibration is applied to the entire optical scanning device, then the entire optical scanning device vibrates, and optical beams which are reflected and scanned by the mirror portion 11 are affected by this vibration and do not vibrate stably, so that the problem arises that it is not possible to guarantee an accurate optical scan. Accordingly, assuming that the optical scanning device will be used in practical applications such as in portable devices and the like, it is necessary to improve this instability which is caused by this entire optical scanning device being supported by a cantilever structure.

Therefore, as shown in FIG. 12, in the invention, the optical scanning device is fixed by means of narrow-width substrate connecting bars 33 to an extremely rigid substrate fixing frame 32 which is positioned so as to surround the entire cantilever supported optical scanning device at positions separated from the supported portion supported by the supporting component 13.

At this time, the resonance state of the actual optical scanning device itself changes depending on the fixing positions of the substrate connecting bars 33, and is affected by the scan angle and resonance frequency of the mirror portion 11.

FIGS. 13 and 14 show the results when this state was examined. As shown in PART (a) of FIG. 13, if the optical scanning device is fixed by the substrate connecting bars 33 at the base of cantilever beam portions 14 whose vibration amplitude close to the center of the vibration is large when the mirror portion 11 is in torsional resonance state, then the scanning amplitude of the mirror portion 11 is considerably reduced, namely, by approximately 17° compared to the scanning amplitude of approximately 55° which is obtained when the optical scanning device is not fixed. This is because if a large portion of the vibration amplitude is fixed at the outer peripheral portion of the optical scanning device so that this vibration is suppressed, then the vibration mode of the entire optical scanning device substrate 10 is changed, which results in it becoming impossible to efficiently transmit energy to the torsional vibration of the mirror portion 11.

In contrast to this, in the state shown in FIG. 14 in which the substrate connecting bars 33 are not connected, when the mirror portion 11 is in torsional resonance state, if, as shown in PART (d) of FIG. 13, the optical scanning device is connected and fixed by the substrate connecting bars 33 in a portion in the vicinity of a bottom point 35 where a vibration amplitude in the Z axial direction of the edge portion of the optical scanning device substrate 10 (i.e., a portion indicated by the symbol 34 in FIG. 14) is at the minimum, then the scanning amplitude of the mirror portion 11 becomes a slightly larger scanning amplitude, namely, approximately 55°, than when it is not fixed to the substrate fixing frame 32. In this case, because the vibration mode of the entire optical scanning device substrate 10 is not changed, it is possible to maintain a substantially equivalent resonance state compared with when the optical scanning device is not fixed, and any effects on the scanning amplitude of the mirror portion 11 of the optical scanning device substrate 10 which has been fixed by the substrate connecting bars 23 are kept to a minimum.

Accordingly, if the optical scanning device is fixed via the outer edge portion of the optical scanning device by means of the substrate connecting bars 33 at the bottom point of the vibration when the mirror is resonating, or at the point where the vibration amplitude is the smallest and which is also furthest away from the optical scanning apparatus supporting component 13, then it is possible to stably support the optical scanning device against any external disturbance vibration without attenuating the scanning amplitude of the mirror portion 11.

When the scan jitter and optical face tangle error (i.e., the stability of the beam scanning speed) of the optical beams in the above-described optical scanning device of the invention were evaluated by a MEMS scanner measurement system (ALT-9A44) manufactured by ALT Ltd., it was found that while scan jitter of a conventional silicon MEMS optical scanner (manufactured by Nippon Signal) was Jp-p: 0.2 to 0.3%, irrespective of the fact that the optical scanning device of the invention was formed from a metal material, the scan jitter at scan resonance frequencies of 6 kHz, 16 kHz, and 24 kHz was smaller by a factor of 10, namely, Jp-p: 0.06%. It was thus possible to achieve a high-accuracy optical beam scan which equated to conventional polygon mirror technology. Moreover, in conventional polygon mirror technology, the optical face tangle error is approximately Wp-p: 30 to 40 seconds, and it is necessary to apply correction using an f-Θ lens or the like and lower the value by a factor of 10. However, in the optical scanning device of the invention, the optical face tangle error is approximately Wp-p: 5 seconds which is a lower value by a factor of 10, so that it is possible to achieve a highly stable beam scanning speed without a correction lens system, so that reductions in both size and cost can be achieved easily. From the above-described measurement results, in the optical scanning device of the invention, it is evident that it is possible to obtain an excellent optical beam scanning accuracy which can be used in a laser printer and the The invention provides the excellent effects described below.

(1) By providing a substrate shape control device which controls the shape of the substrate itself on a substrate having torsion bar portions which support a mirror portion, it is possible to control the spring constant and shape of the substrate such that, even if there is a change in the resonance frequency because of changes in the surrounding environmental temperature, these changes can be canceled out, and it is possible to keep constant the resonance frequency of the torsional vibration of the mirror portion which is being supported by the torsion bar portions.

(2) By making the width of the cantilever beam portions which support the torsion bar portions not greater than or equal to ⅙ the width of the substrate, temperature compensation can be achieved easily, and it becomes possible to provide an optical scanning device which has a stable scan angle over a wider temperature range.

(3) By making the length between the connection portions where the cantilever beam portions which support the torsion bar portions connect to the torsion bar portions and the open end portion shorter than the length between the connection portions where the cantilever beam portions connect to the torsion bar portions and the base ends of the cantilever beam portions, temperature compensation can be achieved easily, and it becomes possible to provide an optical scanning device which has a stable scan angle over a wider temperature range.

(4) By making the ratio (w/t) between the thickness t and the width w of a cross section of the torsion bar portions not greater than or equal to 1.5, temperature compensation can be achieved easily, and it becomes possible to provide an optical scanning device which has a stable scan angle over a wider temperature range.

(5) By setting the resonance frequency of the mirror portion which is determined by the mass of the mirror portion 11 and by the spring constant of the torsion bars away from the resonance frequency of the substrate, it is possible to transmit vibration energy generated at a position separated from the mirror portion efficiently as energy which creates torsional vibration in the mirror portion.

(6) By positioning a substrate fixing frame so that it surrounds the substrate main body and cantilever beam portions and then fixing it on the fixing end side of the substrate main body, and by connecting together the substrate main body and the substrate fixing frame by means of substrate connecting bars at a position away from the supporting component and also in the vicinity of the minimum amplitude of the substrate vibration, it is possible to stably support the optical scanning device against external disturbance vibration without attenuating the scanning amplitude of the mirror portion.

BRIEF DESCRIPTION OF THE DRAWINGS

FIG. 1 is a perspective view of an optical scanning device. PART (a) of FIG. 1 shows the optical scanning device which uses plate waves or vibration and PART (b) of FIG. 1 shows a perspective view of principal portions illustrating a state in which the thickness of only the substrate portion of the optical scanning device shown in PART (a) of FIG. 1 has been doubled.

FIG. 16 is an explanatory view of an optical scanning device according to Example 3 of the invention in which a shape memory alloy is used as a drive source for frequency adjustment.

FIG. 17 is an explanatory view of an optical scanning device according to Example 4 of the invention in which a bimetal structure formed from materials having different coefficients of thermal expansion is used as a drive source for frequency adjustment, with PART (a) of FIG. 17 being a plan view thereof and PART (b) and PART (c) of FIG. 17 being side views illustrating an operation thereof.

DESCRIPTION OF THE PREFERRED EMBODIMENTS

The best embodiments for implementing the optical scanning device according to the invention will now be described based on examples with reference made to the drawings.

Example 1

Figure 2:
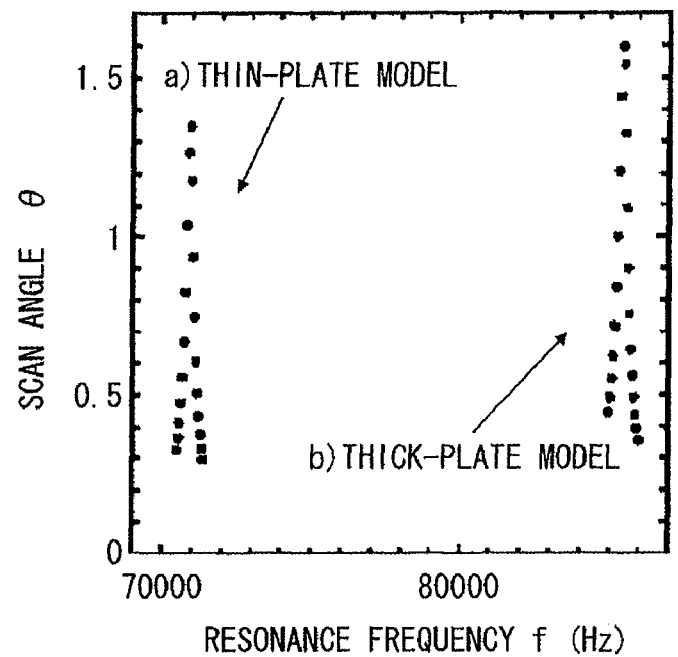
FIG. 2 is a view illustrating a comparison of the resonance frequency f and the scan angle θ between the thin-plate model shown in PART (a) of FIG. 1 and the thick-plate model shown in PART (b) of FIG. 1.
Figure 3:
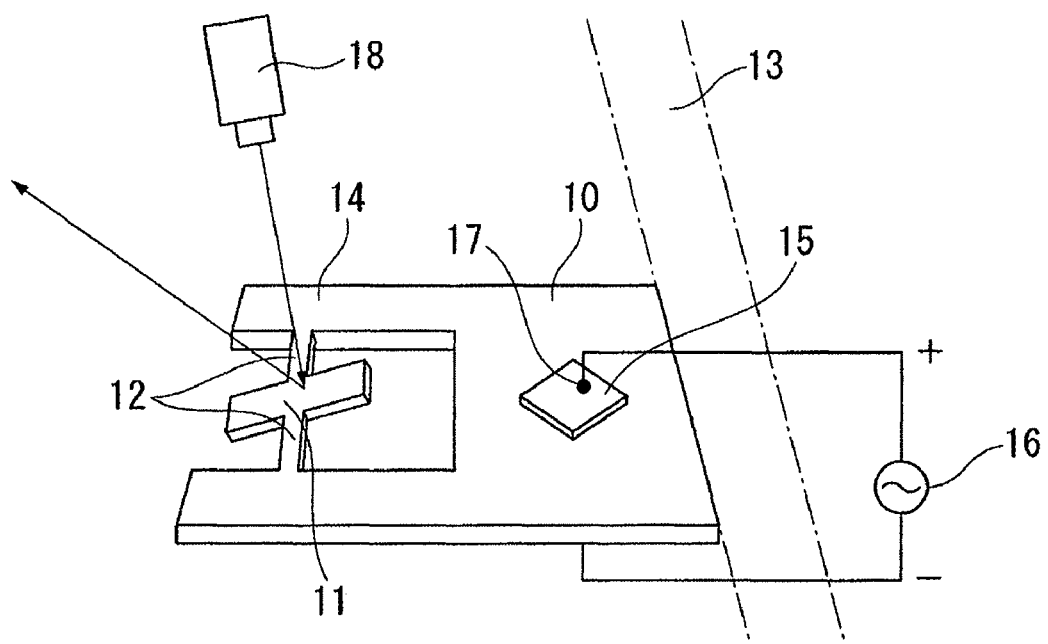
FIG. 3 is a perspective view showing the basic structure of the optical scanning device which is the subject of the invention.
Figure 4A:
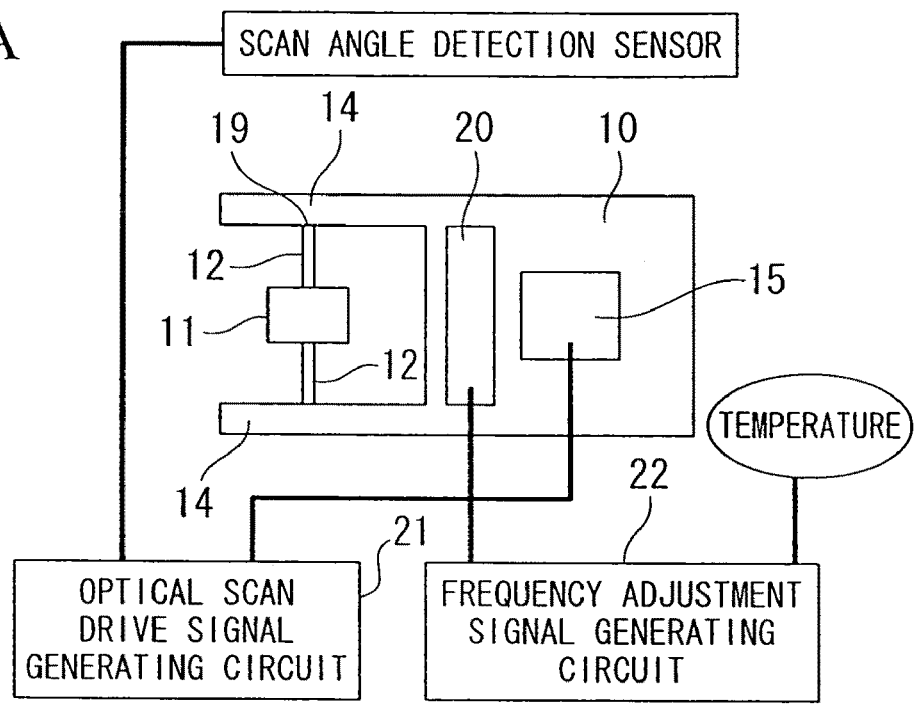
FIGS. 4A and 4B are explanatory views of the optical scanning device according to Example 1 of the invention when a stress-applying piezoelectric film is used as a drive source for adjusting frequency.

FIG. 4A is a plan view of an optical scanning device according to Example 1 when a stress-applying piezoelectric film is used as a drive source for frequency adjustment. A supporting component 13 which supports a substrate 10 is omitted from this drawing. The optical scanning device which is the subject of the present example has the same basic structure as that shown in FIG. 3, and, unless stated otherwise, symbols which are the same as those shown in FIG. 3 are used to indicate the same components.

A mirror portion 11 which reflects and scans optical beams (omitted from the drawings) is connected to the substrate 10 by two torsion bar portions 12, and an optical scan driving piezoelectric film 15 is formed on a portion of the top of the substrate away from linking portions 19 which link together cantilever beam portions 14 and the torsion bar portions 12 of the substrate 10. In order to form the optical scan driving piezoelectric film 15 away from the linking portions 19 on a portion of the top of the substrate, it is sufficient if the optical scan driving piezoelectric film 15 is not formed on at least the cantilever beam portions 14, but is formed on a portion of the substrate main body portion such as, for example, as shown in FIGS. 4A and 4B, in a center portion of the substrate main body portion.

The optical scan driving piezoelectric film 15 vibrates in piezoelectric oscillation as a result of a drive signal being supplied from an optical scan drive signal generating circuit 28 to the optical scan driving piezoelectric film 15. This results in a plate wave or vibration being induced in the substrate 10, and in torsional vibration being induced in the mirror portion 11. Moreover, a separate stress-applying piezoelectric film 20 which is a substrate shape control device used to impart mechanical distortion to the substrate 10 and thereby change a resonance frequency f of the mirror portion 11 is provided on the substrate 10 on the mirror portion 11 side of the optical scan driving piezoelectric film 15. The stress-applying piezoelectric film 20 receives adjustment signals from a frequency adjustment signal generating circuit 29. The surface area, shape, and thickness of the stress-applying piezoelectric thick film 20 are preferably able to bring about a large deformation in the substrate 10 by means of the smallest possible applied voltage. In the present example, the substrate 10 is formed by a conductive metal substrate (SUS 304).

Figure 4B:
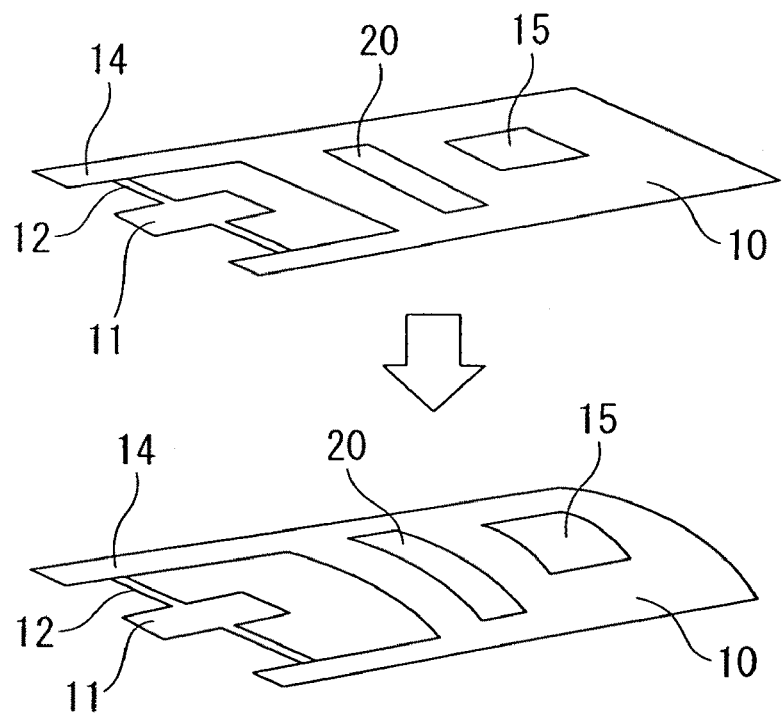

FIG. 4B illustrates an operation of the device shown in FIG. 4A. The stress-applying piezoelectric film 20 which is elongated in a parallel direction relative to the torsion bar portions 12 which support the mirror portion 11 is provided on the substrate 10. When DC voltage is applied thereto, because the substrate 10 and the stress-applying piezoelectric voltage film 20 are stacked together in a unimorph structure, the stress-applying piezoelectric film 20 is deformed in an upward or a downward direction in a horseback shape protruding in a perpendicular direction relative to torsion bar portions 12. As a result, irrespective of the polarity of the voltage applied to the stress-applying piezoelectric film 20, as the absolute value thereof increases, it becomes more difficult for the substrate 10 to bend in a perpendicular direction relative to the torsion bar portions 12, and essentially there is an increase in the spring constant (i.e., the rigidity) of the substrate 10. As a result, the torsional resonance frequency f of the mirror portion 11 increases.

Figure 14:
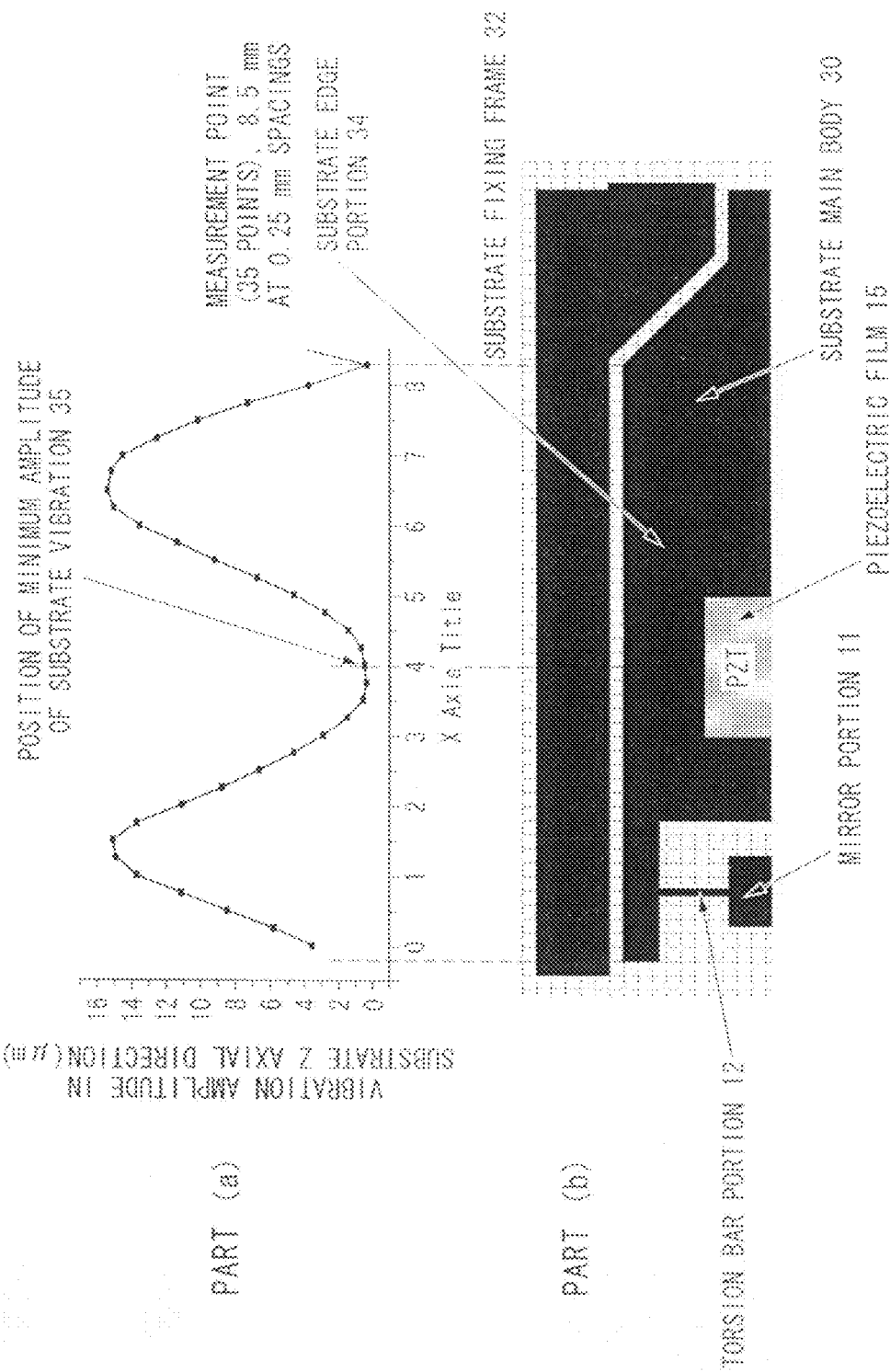
FIG. 14 is an explanatory view illustrating a state of the resonance amplitude of an edge portion of a substrate when the mirror portion is in torsional resonance state when the substrate and the substrate fixing frame are not connected by substrate connecting bars.

A description will now be given of a method of correcting any shift in the resonance frequency which is caused by changes in the surrounding environmental temperature and of correcting the maximum scan angle which is consequently required in this type of optical scanning device. Firstly, as shown in FIG. 4A, the periphery is detected by a temperature sensor and, based on this, a DC bias signal which corrects any decrease in the resonance frequency caused by a rise in temperature such as shown in PART (a) and PART (b) of FIG. 14 is generated by the frequency adjustment signal generating circuit 22, and this signal is then sent to the stress-applying piezoelectric film 20. As a result, the resonance frequency itself of the optical scanning device is changed, and any shift in the resonance frequency caused by changes in temperature is corrected. Using this type of structure, it is possible to greatly reduce and correct any change in the resonance frequency of the optical scanning device which is caused by changes in the surrounding environmental temperature, and it is possible to improve the accuracy when the invention is employed in an image display unit or sensor or the like. Moreover, because the resonance frequency of the optical scanning device at this time is kept constant, the increase in the maximum scan angle, although stable, does exhibit slight changes. If this is dealt with, as shown in FIG. 4A, by lowering the drive amplitude of an optical scan drive signal generated by the optical scan drive signal generating circuit 21 in accordance with the increase in the scan angle detected by a separately provided scan angle detection sensor, and correction is then performed to keep the scan angle constant in the optical scanning device, there is a further improvement in the accuracy of the scanning stability which is due to changes in the surrounding environmental temperature.

As described above, according to the invention, instead of adjusting the frequency of the drive signal from an optical scan drive signal generating circuit to match changes in the torsional resonance frequency of the mirror portion of an optical scanning device in response to peripheral temperature changes and thereby keeping the maximum scan angle of the optical scanning device constant (as in the conventional technology), it is possible to keep constant the actual resonance frequency itself of the optical scanning device which follows temperature variations and, at the same time, to also keep the maximum scan angle constant. As a result of this, it is possible to keep constant the clock (i.e., the time axis) which is determined by the resonance frequency, and it becomes possible to apply optical scanning devices which use the principle of resonance in a wide range of applications such as high-accuracy display units, precision measuring instruments, and optical sensors and the like with a high degree of accuracy.

Moreover, it is preferable for the placement on the substrate 10 of the stress-applying piezoelectric film 20 which is intended to change the spring constant (i.e., rigidity) of the substrate 10, as well as the shape, surface area, and thickness thereof to be able to bring about a large deformation in the substrate 10 by means of the smallest possible applied voltage. For example, if the stress-applying piezoelectric film 20 is formed over the entire surface of the substrate 10, and if the film thickness of the stress-applying piezoelectric film 20 is determined in accordance with the thickness of the substrate 10 such that the maximum displacement can be obtained using the minimum voltage (described in detail in Japanese Patent Application No. 2005-115352, previous application from the applicants of the present specification), then this is more favorable as the spring ratio (i.e., rigidity) of the entire substrate 10 increases uniformly.

Figure 5:
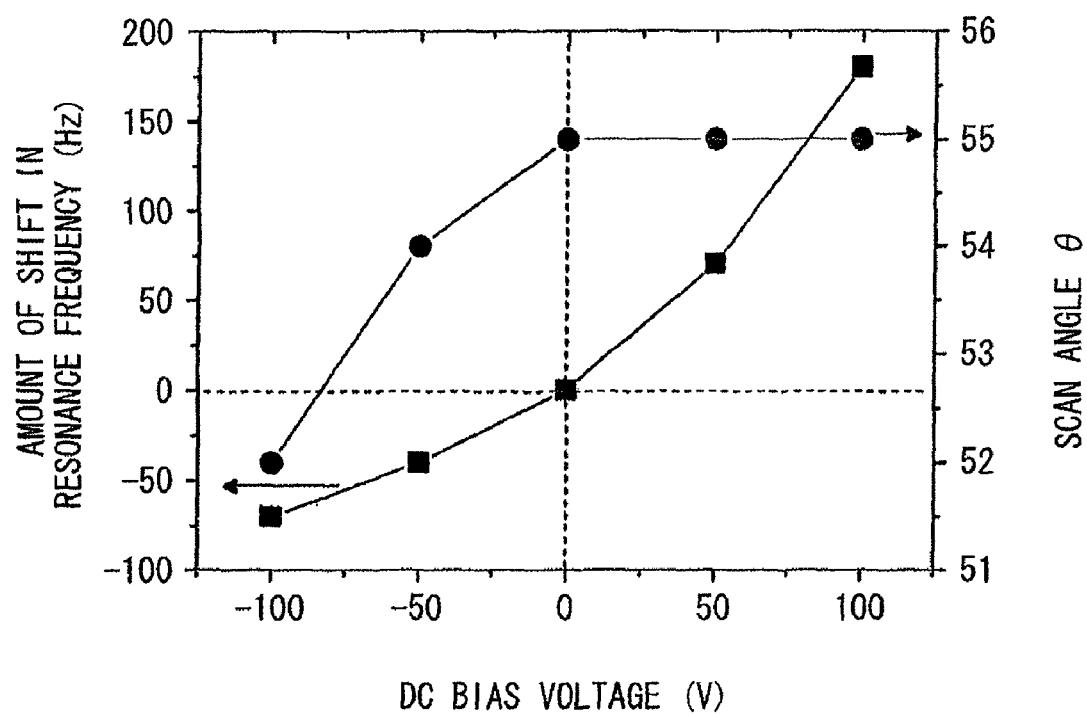
FIG. 5 is a view showing experiment results for Example 1 shown in FIGS. 4A and 4B.

As shown in FIG. 5, in the experiment results, the amount of change in the resonance frequency either increases or decreases in the manner of a two-dimensional function in accordance with the polarity of the voltage applied to the stress-applying piezoelectric film 20, however, the reason for this is that, because the substrate 10 is deformed even when no voltage is being applied, namely, when the stress-applying piezoelectric film 20 has simply been formed on the substrate 10, the resonance frequency decreases until negative voltage is applied to the stress-applying piezoelectric film 20 and makes the substrate 10 flat and the amount of deformation zero. Moreover, it was possible to increase the resonance frequency f to approximately 200 Hz using an applied voltage of 100 V in a sample optical scanning device in which the resonance frequency f was from approximately 500 Hz to 300 kHz.

Figure 6:
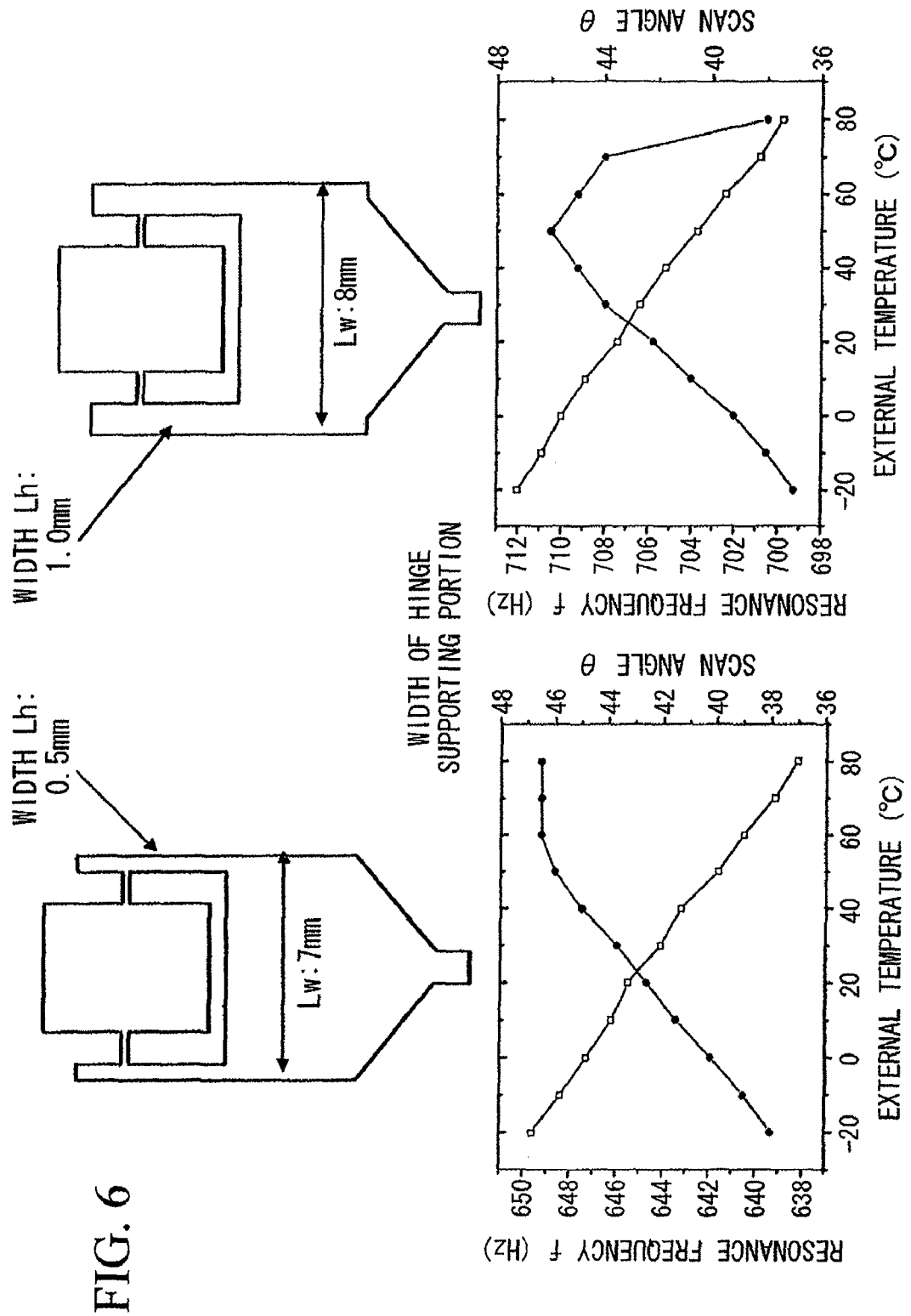
FIG. 6 is a view showing the torsional resonance frequency f in the torsional direction of the mirror portion of an optical scanning device, and the temperature dependency of the scan angle θ, and experiment results when the ratio between the width Lh of the cantilever beam portions relative to the width Lw of the substrate which corresponds to these was changed.
Figure 7:
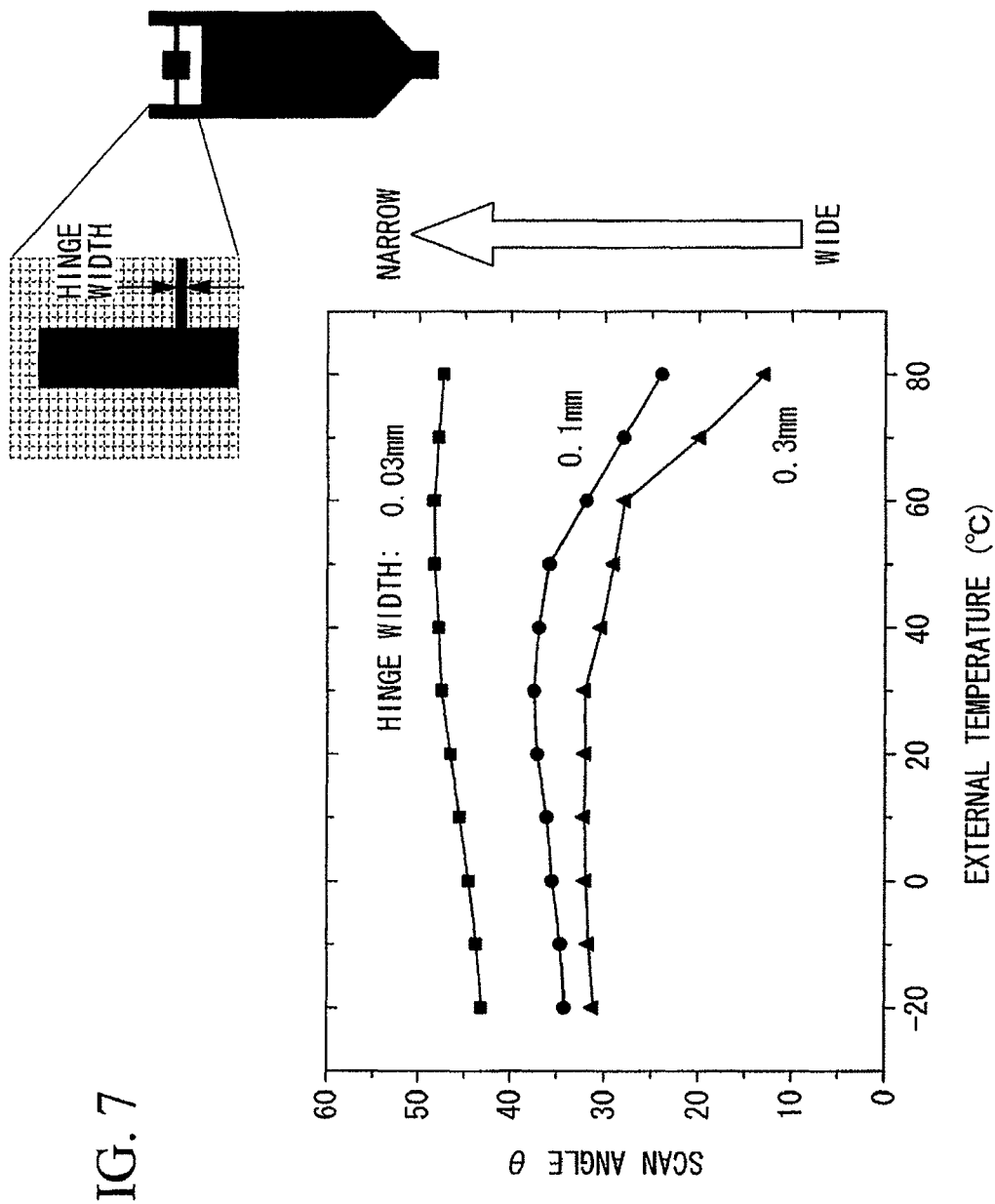
FIG. 7 is a view showing the torsional resonance frequency f in the torsional direction of the mirror portion of an optical scanning device, and the temperature dependency of the scan angle θ, and experiment results when the ratio between the thickness t and the width w of the torsion bar portions which correspond to these was changed.
Figure 8:
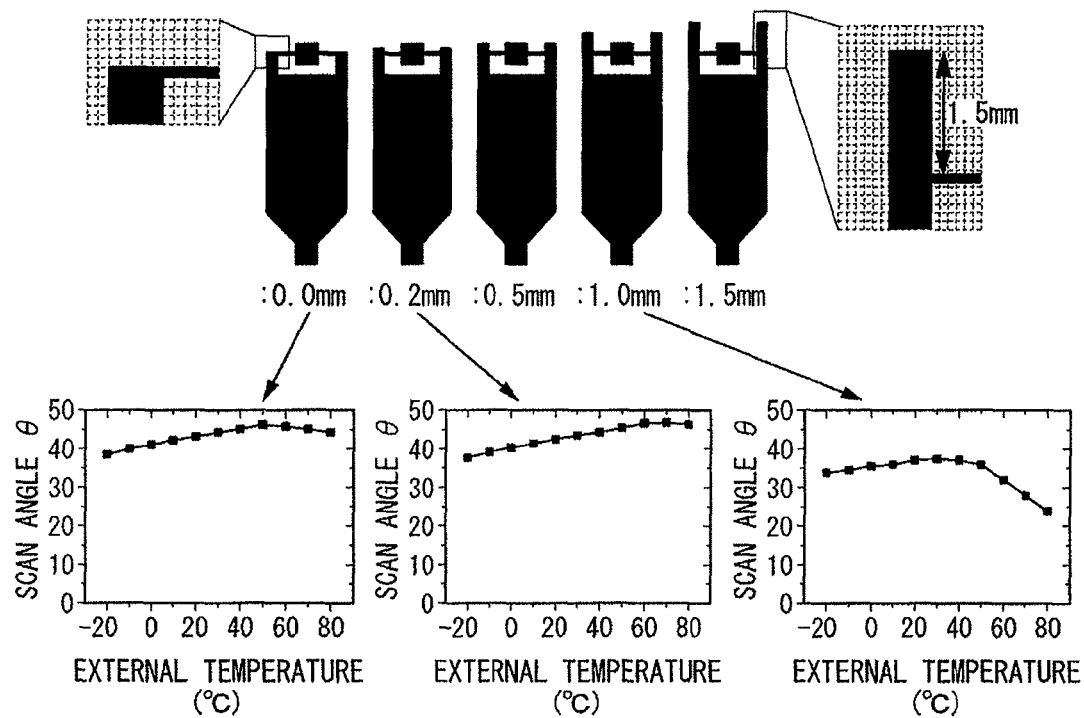
FIG. 8 is a view showing the temperature dependency of the scan angle θ in the torsional direction of the mirror portion of an optical scanning device, and experiment results when the mounting positions on the cantilever beam portions of the torsion bar portions which correspond to these were changed.
Figure 9:
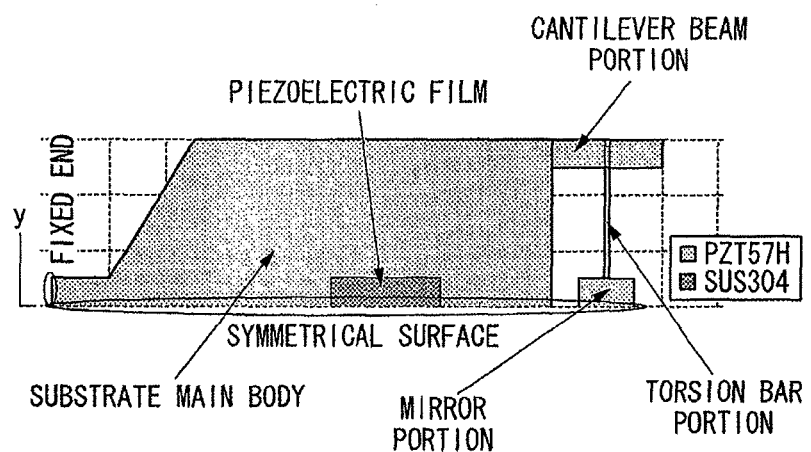
FIG. 9 is a plan view of an optical scanning apparatus of the invention which has a structure in which a single piezoelectric film is formed on a substrate main body, with a surface where Y=0 being taken as a plane of symmetry, and with half of this being used as a model.
Figure 10:
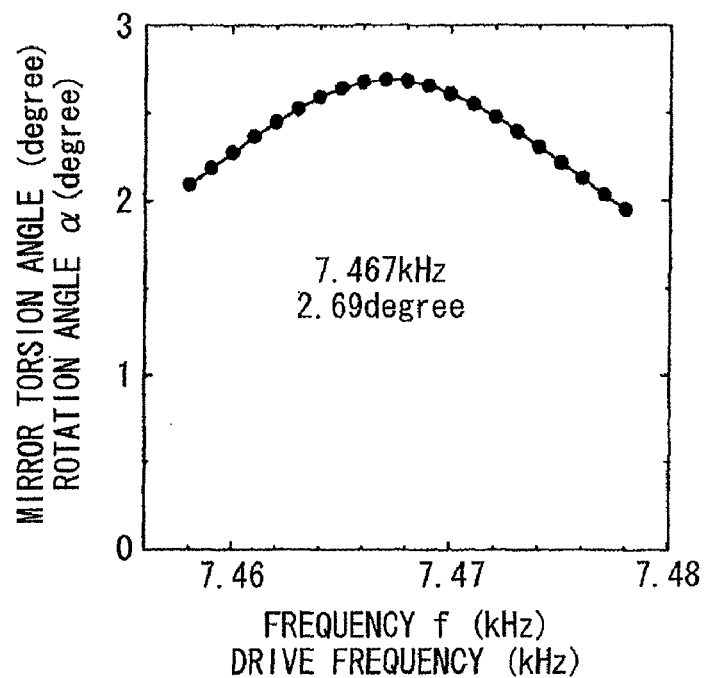
FIG. 10 is a view showing a torsion angle of a mirror portion of the device shown in FIG. 9.
Figure 11:
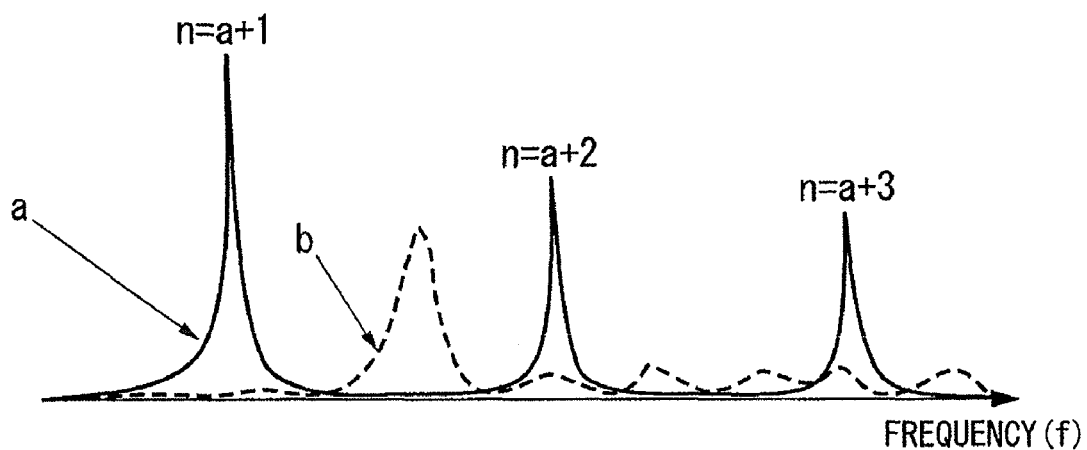
FIG. 11 is a view showing resonance frequencies of the substrate and mirror portion of the optical scanning device according to the invention.
Figure 12:
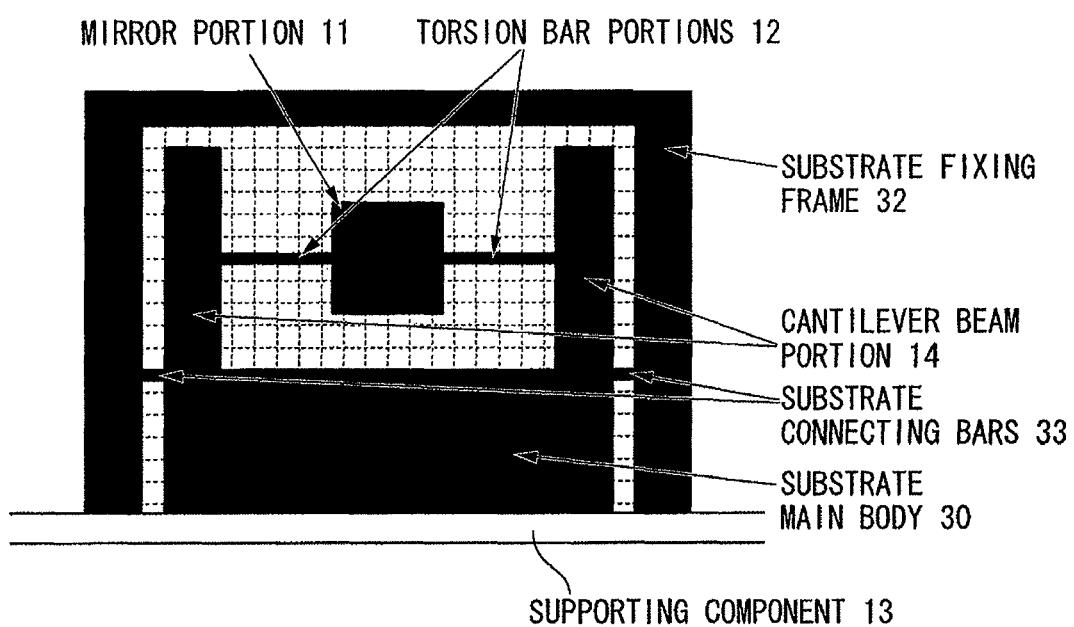
FIG. 12 is a plan view of a device in which a substrate fixing frame has been positioned so as to surround the substrate main body and cantilever beam portions according to the invention.
Figure 13:
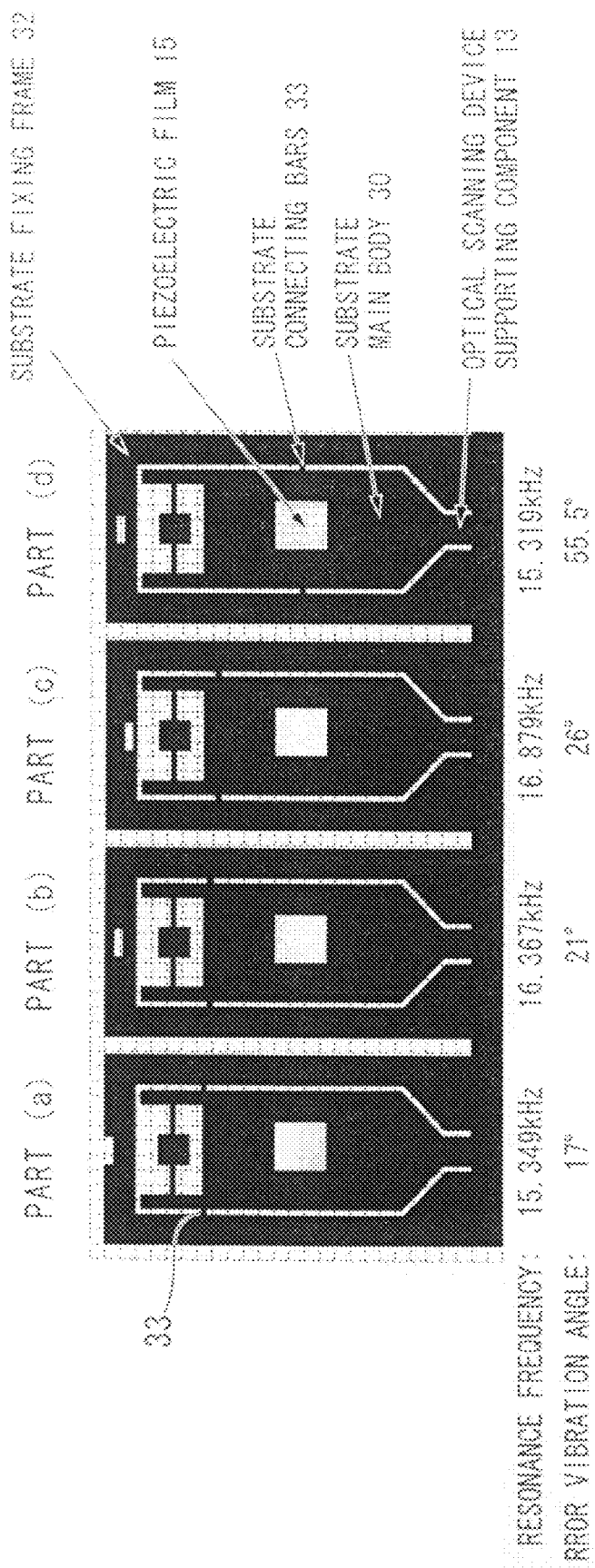
FIG. 13 is a view illustrating mirror torsion angles when the position of substrate connecting bars which connect together a substrate and a substrate fixing frame was changed.

FIGS. 6 to 8 show a relationship between the torsional resonance frequency f in the torsion direction of the mirror portion 11 of the optical scanning device, the temperature dependency of the scan angle θ, and the shape of the substrate 10, cantilever beam portions 14, and torsion bar portions 12 and the like of the optical scanning device which corresponds to these (referred to below as the 'shape of the optical scanning device'). The scan angle θ is measured and adjusted such that the drive frequency is always at the maximum scan angle in accordance with changes in the resonance frequency f which accompany changes in temperature.

In the shapes of all of the optical scanning devices shown in FIGS. 6 to 8, the torsional resonance frequency f monotonically decreases as the temperature rises.

Table 1 shows the results when the width of the change in the resonance frequency was examined for various optical scanning devices in which the torsion resonance frequencies f were mutually different within a temperature range of −20° C. to 80° C. The resonance frequency f decreased monotonically as the surrounding environmental temperature changed for all of the resonance frequencies from several hundred Hz up to 30 kHz or more. If the width of this decrease was standardized as a resonance frequency, then it was a maximum of approximately 1 to 2%, namely, if this is converted into a specific frequency change amount, from approximately 11 Hz to 800 Hz in the aforementioned frequency range.

TABLE 1

| Resonance frequency temperature dependency of optical scanning device | | | | | |
|---|---|---|---|---|---|
| Resonance frequency (fo: Hz) | 640 | 6.7 k | 15.7 k | 23 k | 35 k |
| Frequency shift amount (Δf: Hz at −20° to 80°) | 11 | 120 | 350 | 450 | 800 |

From the above, it was found that the reduction in the torsional resonance frequency f of the mirror portion 11 of the optical scanning device which is brought about by a rise in the peripheral temperature can be satisfactorily controlled by forming the stress-applying piezoelectric film 20 on the substrate 10 of an optical scanning device, and applying DC voltage thereto. It is clear that this type of method of applying deformation to the substrate 10 is the same even if a magnetostrictive material replaces the piezoelectric film. Moreover, the material used to form the substrate 10 of an optical scanning device is not restricted to being a metal material such as stainless steel, and it is clear that the same effects can be achieved using a silicon structure formed by micromachining such as those described in the prior documents 1, 2, and 3.

Example 2

Figure 15:
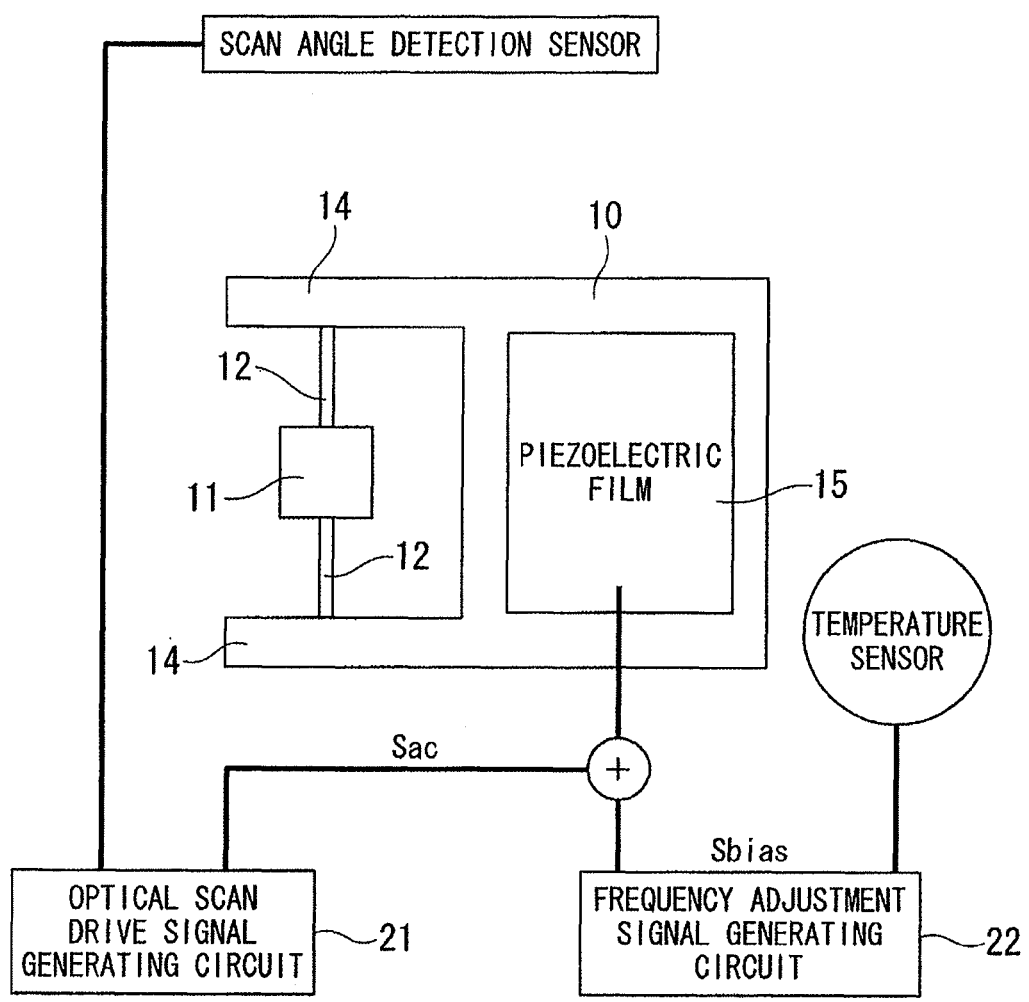
FIG. 15 is a plan view of an optical scanning device according to Example 2 of the invention in which an optical scan driving piezoelectric film which is a source for generating plate waves or vibrations in order to cause a mirror portion to scan at high speed is used for controlling the shape of a substrate.

FIG. 15 is a plan view of an optical scanning device according to Example 2 in which, in the above-described optical scanning device, instead of the stress-applying piezoelectric film 20 or stress-applying magnetostrictive film which is used as a drive source to deform the substrate 10 and thereby change the spring constant thereof in order to adjust the frequency, the optical scan driving piezoelectric film 15 which is a source for generating plate waves or vibration in order to cause the mirror portion to scan at high speed is used for controlling the substrate shape. The supporting component 13 which supports the substrate 10 has been omitted from the drawing. The optical scanning device which is the subject of the present example has the same basic structure as that in Example 1, and unless specifically stated otherwise, components which are the same as those in Example 1 are indicated by the same symbols.

In the present example, the optical scan driving piezoelectric film 15 doubles as a vibration source for causing the mirror portion 11 to resonate. The drive signal for this is formed by superimposing a DC bias signal Sbias which is generated by a frequency adjustment signal generating circuit 22 in order to adjust the above-described torsional resonance frequency on an AC signal Sac which matches the torsional resonance frequency f of the mirror portion 11 and is generated by the optical scanning drive signal generating circuit 21.

This Sac+Sbias signal is applied to the optical scan driving piezoelectric film 15 which is a plate wave generation source in order to cause the mirror portion 11 to scan at high speed, and the resonance frequency of the mirror portion 11 is driven and adjusted such that it remains constant. Because the substrate 10 and the optical scan driving piezoelectric film 15 are mutually superimposed in a unimorph structure, the substrate 10 is deformed in a convex or concave shape centered on the portion where the optical scan driving piezoelectric film 15 is formed, and the spring constant thereof is raised because of an increase in the internal stress of the substrate 10 or because of an increase or in the bending elasticity which is caused by a change in the shape of the substrate 10. As a result of this, the resonance frequency of the mirror portion 11 shifts to the high-frequency side. In experiments, in the case of an optical scanning device having a torsional resonance frequency of approximately 10 kHz, it was possible to impart a change to the above-described resonance frequency of approximately 100 Hz by means of the above-described DC bias signal.

As a result of the above, by applying a frequency adjustment DC bias signal Sbias to the optical scan driving piezoelectric film 15 which is a source for generating plate waves or vibration in order to cause the mirror portion which is formed on the substrate 10 of the optical scanning device to scan at high speed, the reduction in the torsional resonance frequency f of the mirror portion 11 of an optical scanning device which is brought about by a rise in the surrounding temperature can be controlled such that changes in the resonance frequency f which are caused by variations in the surrounding environmental temperature are eliminated, and such that the resonance frequency f is kept constant.

A description will now be given of the shift in the resonance frequency which is caused by changes in the surrounding environmental temperature and of a method of correcting the maximum scan angle which accompanies this shift in the above-described optical scanning device. Firstly, as shown in FIG. 15, the periphery is detected by a temperature sensor and, based on this, a DC bias signal which corrects any decrease in the resonance frequency caused by a rise in temperature such as shown in FIGS. 20 (a) and 20 (b) is generated by the frequency adjustment signal generating circuit 22, and this signal is then input into the optical scan driving piezoelectric film 15. As a result, the resonance frequency itself of the optical scanning device is changed, and any shift in the resonance frequency caused by changes in temperature is corrected. As shown in FIG. 15, the DC bias signal which corrects the decrease in the resonance frequency at this time is superimposed on an optical scan drive signal, and is input directly into the optical scan driving piezoelectric film 15. Using this type of structure, it is possible to greatly reduce and correct any change in the resonance frequency of the optical scanning device which is caused by a change in the surrounding environmental temperature, and it is possible to improve the accuracy when the invention is employed in an image display unit or sensor or the like. Moreover, because the resonance frequency of the optical scanning device at this time is kept constant, the increase in the maximum scan angle, although stable, does exhibit slight changes. If this is dealt with, as shown in FIG. 15, by lowering the drive amplitude of an optical scan drive signal generated by the optical scan drive signal generating circuit 21 in accordance with the increase in the scan angle detected by a separately provided scan angle detection sensor, and correction is then performed to keep the scan angle constant in the optical scanning device, there is a further improvement in the accuracy of the scanning stability which is due to changes in the surrounding environmental temperature.

As described above, according to the invention, instead of adjusting the frequency of the drive signal from an optical scan drive signal generating circuit to match changes in the torsional resonance frequency of the mirror portion of an optical scanning device in response to changes in the surrounding temperature and thereby keeping the maximum scan angle of the optical scanning device constant (as in the conventional technology), it is possible to keep constant the actual resonance frequency itself of the optical scanning device which follows temperature variations and, at the same time, to also keep the maximum scan angle constant. As a result of this, it is possible to keep constant the clock (i.e., the time axis) which is determined by the resonance frequency, and it becomes possible to apply optical scanning devices which use the principle of resonance to a wide range of applications such as high-accuracy display units, precision measuring instruments, and optical sensors and the like with a high degree of accuracy.

Example 3

FIG. 16 is a view showing an optical scanning device according to Example 3 in which, instead of the above-described stress-applying piezoelectric film or stress-applying magnetostrictive film, a shape memory alloy is used as the frequency adjustment drive source. PART (a) of FIG. 16 is a plan view thereof, while PART (b) and PART (c) of FIG. 16 are side views showing an operation thereof. The supporting component 13 which supports the substrate 10 and the drive power supply system have been omitted from the drawings. The optical scanning device which is the subject of the present example has the same basic structure as that in Example 1, and unless specifically stated otherwise, components which are the same as those in Example 1 are indicated by the same symbols.

Commercially available KIOKALLOY: a Ni—Ti$_2$ element alloy material having a Ni percentage content of 47% to 56% and a phase transition temperature (i.e., a recovery temperature) of approximately 40° C. to 90° C. was used for the shape memory alloy material. A frequency adjustment shape memory alloy thin-plate 23 formed from this material was adhered onto the substrate 10 of the optical scanning device. This frequency adjustment shape memory alloy thin-plate 23 this is used is bent in advance to a deformation amount deemed suitable for the estimated deformation amount to be imparted to the substrate 10. Heat processing is then performed thereon, so that the frequency adjustment shape memory alloy thin-plate 23 is made to remember this shape. In this manner, the frequency adjustment shape memory alloy thin-plate 23 is adhered onto the substrate 10 instead of the above-described stress-applying piezoelectric film or stress-applying magnetostrictive film. In this example, in accordance with the design of the optical scanning device, the frequency adjustment shape memory alloy thin-plate 23 may be adhered onto either the front surface side or the rear surface side of the substrate 10. Moreover, if the directions thereof are aligned such that the bending is in the same direction during the phase transition, then it is possible to adhere a frequency adjustment shape memory alloy thin-plate 23 onto both surfaces of the substrate 10, so that more effective deformation can be generated.

Moreover, in this example, the optical scan driving piezoelectric film 15 is adhered onto the frequency adjustment shape memory alloy thin-plate 23.

In an optical scanning device manufactured in this manner, if the surrounding environmental temperature increases as far as the vicinity of the aforementioned phase transition temperature (i.e., recovery temperature), the substrate 10 of the optical scanning device attempts to return to its memorized shape. As a result, a deformation is generated in the substrate 10 of the optical scanning device, and the substrate 10 becomes deformed in either a convex or concave shape centered on the portion thereof where the frequency adjustment shape memory alloy thin-plate 23 is adhered. The spring constant thereof then rises because of an increase in the internal stress of the substrate 10 or because of an increase in the bending elasticity which is caused by a change in the shape of the substrate 10. As a result of this, the resonance frequency of the mirror portion 11 shifts to the high-frequency side. As a result of the above, the reduction in the torsional resonance frequency f of the mirror portion 11 of the optical scanning device which is brought about by a rise in the surrounding environmental temperature is compensated by forming the frequency adjustment shape memory alloy thin-plate 23 on the substrate 10 of an optical scanning device, and without performing control by means of the above-described electrical control signals, and without using sensors to detect changes in the surrounding environmental temperature or using electronic control circuits, changes in the resonance frequency f which are caused by variations in the surrounding environmental temperature can be eliminated, and the resonance frequency f can be kept constant using an extremely simple structure. Moreover, as in the case of the present example, when a shape memory alloy material is used for frequency adjustment, the deformation of the substrate 10 can be made bigger more easily compared with when other means are used. Accordingly, as the frequency adjustment range can be enlarged, this method is more effective.

Example 4

FIG. 17 is an explanatory view showing an optical scanning device according to Example 4 in which, instead of the above-described stress-applying piezoelectric film or stress-applying magnetostrictive film, a bimetal structure formed by materials having mutually different coefficients of thermal expansion is used as the frequency adjustment drive source. PART (a) of FIG. 17 is a plan view thereof, while PART (b) and PART (c) of FIG. 17 are side views showing an operation thereof. The supporting component 13 which supports the substrate 10 and the drive power supply system have been omitted from the drawings. The optical scanning device which is the subject of the present example has the same basic structure as that in Example 1, and unless specifically stated otherwise, components which are the same as those in Example 1 are indicated by the same symbols.

This bimetal structure is a structure formed by laminating two or three layers of materials having mutually different coefficients of thermal expansion. When the temperature of the structure changes, a bending motion is generated due to the differences in the coefficients of thermal expansion in the structure. In the present example, for example, when the substrate 10 is formed from a metal material such as stainless steel, a ceramic material or glass material or the like having a small coefficient of thermal expansion may be adhered onto this. Alternatively, a thin-film formation method such as an aerosol deposition method (i.e., an AD method) or a sputtering method may be used, or a thermal oxidation method or anodic oxidation method may be used to form the bimetal structure.

In actuality, if SUS 304 (having a coefficient of thermal expansion of $17.3 \times 10^{-6}$/K) is used for the material of the substrate 10, and an alumina thin-plate (having a coefficient of thermal expansion of $7.7 \times 10^{-6}$/K), a silicon nitride substrate (having a coefficient of thermal expansion of $3.5\times10^{-6}$/K), a silicon carbide substrate (having a coefficient of thermal expansion of $4.0\times10^{-6}$/K), or a quartz thin-plate (having a coefficient of thermal expansion of $0.54\times10^{-6}$/K) is used for the frequency adjustment low thermal expansion material film 24 which is adhered onto the substrate 10, then differences from approximately a magnitude of 2 to a magnitude of 32 can be set between the coefficients of thermal expansion. By adjusting the thickness of the substrate 10 and the thickness of the frequency adjustment low thermal expansion material film 24 which is formed thereon or adhered thereon, the amount of deformation per rise in temperature can be increased to the maximum possible. Furthermore, if a metal substrate having a low coefficient of thermal expansion such as Invar, Super Invar, or Cobalt (having a coefficient of thermal expansion of $1\times10^{-6}$/K to $3\times10^{-6}$/K) is used for the material of the substrate 10, then the changes in the resonance frequency in response to temperature variations can be reduced more effectively.

In an optical scanning device manufactured in this manner, if the surrounding environmental temperature rises, because the portion on the substrate 10 of the optical scanning device where the frequency adjustment low thermal expansion material film 24 is formed has a bimetal structure, bending deformation is generated therein because of the difference between the coefficient of thermal expansion of the substrate 10 of the optical scanning device and the coefficient of thermal expansion of the frequency adjustment low thermal expansion material film 24, and the substrate 10 becomes deformed in either a convex or concave shape centered on the portion where the bimetal structure has been provided. The spring constant thereof then rises because of an increase in the internal stress of the substrate 10 or because of an increase in the bending elasticity which is caused by a change in the shape of the substrate 10. As a result of this, the resonance frequency of the mirror portion 11 shifts to the high-frequency side.

As a result of the above, the reduction in the torsional resonance frequency f of the mirror portion 11 of the optical scanning device which is brought about by a rise in the surrounding environmental temperature is compensated by forming the frequency adjustment low coefficient of thermal expansion material in either a thin-plate or film shape on the substrate 10 of the optical scanning device, and without performing control by means of the above-described electrical control signals, and without using sensors to detect changes in the surrounding environmental temperature or using electronic control circuits, changes in the resonance frequency f which are caused by variations in the surrounding environmental temperature can be eliminated, and the resonance frequency f can be kept constant using an extremely simple structure.

Example 5

Figure 18:
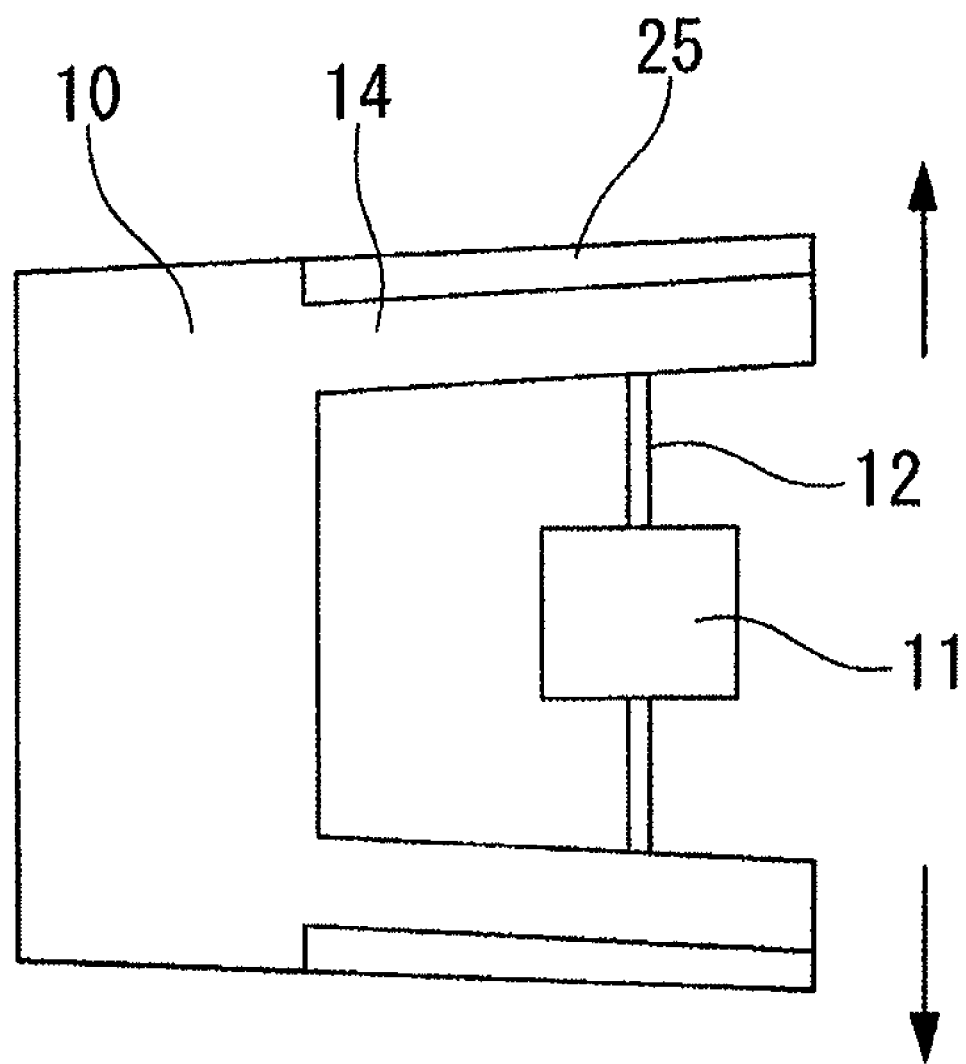
FIG. 18 is a plan view of an optical scanning device according to Example 5 of the invention in which a shape memory alloy or a bimetal structure formed from materials having different coefficients of thermal expansion is formed on cantilever beam portions, and tensile stress in the torsion bar portions is adjusted by the deformation thereof.

FIG. 18 is a plan view showing an optical scanning device according to Example 5 in which a shape memory alloy or a bimetal structure formed by a material having a different coefficient of thermal expansion is formed on the cantilever beam portions 14 which are a portion of the substrate 10 of the optical scanning device and which support the torsion bar portions 12 by which the mirror portion 11 is supported, and in which the tension of the torsion bar portions 12 is adjusted by the deformation of the shape memory alloy or bimetal structure. The supporting component 13 which supports the substrate 10 and the drive power supply system have been omitted from the drawings.

The optical scanning device which is the subject of the present example has the same basic structure as that in Example 1, and unless specifically stated otherwise, components which are the same as those in Example 1 are indicated by the same symbols.

In the present example, as shown in FIG. 18, a shape memory alloy or bimetal structure 25 formed by a material having a different coefficient of thermal expansion is formed on either a part of or on all of the cantilever beam portions 14 which are a portion of the substrate 10 of the optical scanning device and which support the torsion bar portions 12 by which the mirror portion 11 is supported. By deforming the cantilever beam portions 14 which form a portion of the substrate 10 of the optical scanning device by pulling them within the plane of the substrate 10 or by compressing them, the tension of the torsion bar portions 12 supporting the mirror portion 11 is adjusted, and the spring constant of the torsion bar portions 12 is changed in response to changes in the surrounding environmental temperature, thereby controlling the torsional resonance frequency of the mirror portion 11. Accordingly, without performing control by means of electrical control signals or the like, and without using sensors to detect changes in the surrounding environmental temperature or using electronic control circuits, changes in the resonance frequency f which are caused by variations in the surrounding environmental temperature can be eliminated, and the resonance frequency f can be kept constant using an extremely simple structure.

in order to suppress irregularities in the resonance frequency when an optical scanning device is being manufactured, it is also possible to replace the shape memory alloy or bimetal structure 25 formed by a material having a different coefficient of thermal expansion which is formed on either a part of or on all of the cantilever beam portions 14 with a piezoelectric film or magnetostrictive film, and control these through external electrical signals.

Example 6

Figure 19A:
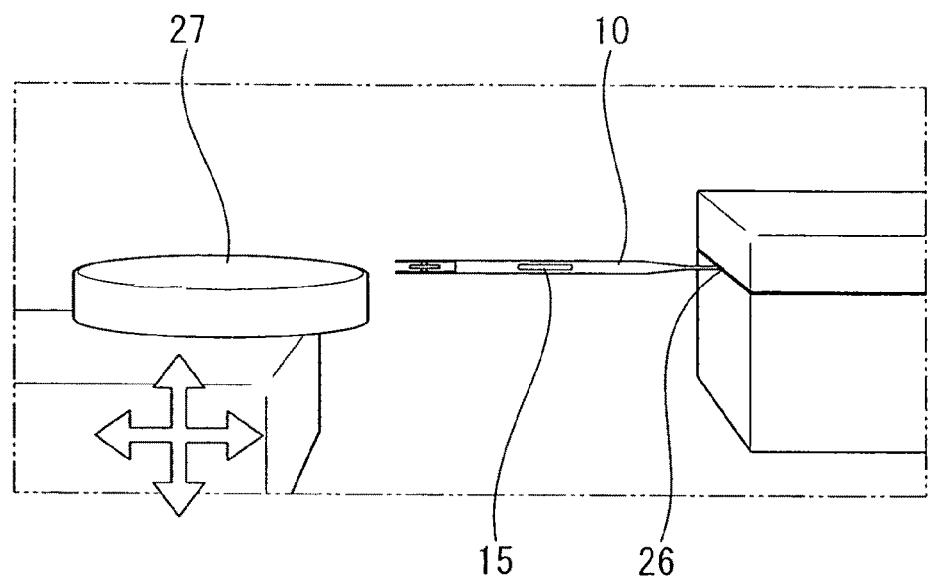
FIGS. 19A and 19B are explanatory views of an optical scanning device according to Example 6 of the invention in which deformation is imparted to a substrate by a mutual interaction between a magnetic material which forms either all of or part of a substrate and an external magnetic field.
Figure 19B:
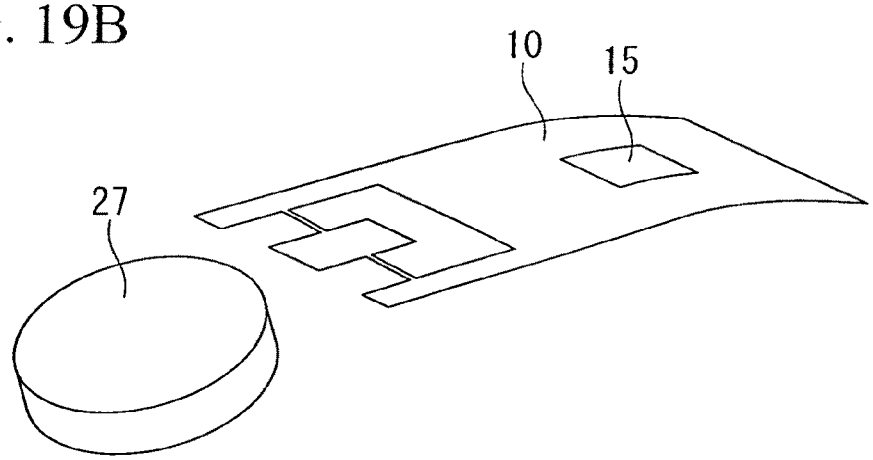

FIGS. 19A and 19B are explanatory views showing an optical scanning device according to Example 6 in which the substrate 10 is deformed by a mutual interaction between a magnetic material which forms either a part of or all of the substrate 10 of the optical scanning device and an external magnetic field. The drive power supply system has been omitted from the drawings. The optical scanning device which is the subject of the present example has the same basic structure as that in Example 1, and unless specifically stated otherwise, components which are the same as those in Example 1 are indicated by the same symbols.

In the present example, the material used to form the substrate 10 of the optical scanning device is stainless steel which has been provided with magnetism, and, as shown in FIG. 19A, the opposite side thereof from the mirror portion 11 is fixed to a fixing portion 26 so that the entire substrate 10 has a cantilever beam structure. If a permanent magnet or electromagnet 27 is brought close to this, then the cantilever beam-shaped substrate 10 warps in accordance with the size of the magnetic field gradient in the vicinity of the substrate 10 which is formed from a magnetic material, and becomes deformed (see FIG. 19B). As a result, irrespective of the polarity of the permanent magnet or electromagnet 27, as the absolute value thereof increases, the spring constant (i.e., the rigidity) of the substrate 10 essentially increases, so that the torsional resonance frequency f of the mirror portion increases. In experiments, as shown in FIGS. 19A and 19B, in the case of an optical scanning device having a torsional resonance frequency of approximately 10 kHz, it was possible to impart a change to the above-described resonance frequency of approximately 200 Hz by means of the externally applied magnetic field. As a result of the above, by applying an external magnetic field which is controlled using an electromagnet or the like to the substrate 10 of an optical scanning device, the reduction in the torsional resonance frequency f of the mirror portion of the optical scanning device which is brought about by a rise in the surrounding temperature can be controlled such that changes in the resonance frequency f which are caused by variations in the surrounding environmental temperature are eliminated, and such that the resonance frequency f is kept constant.

If the substrate 10 of an optical scanning device is formed from a material such as a metal material which can be plastically deformed, then it is also possible to slightly plastically deform the substrate 10 in advance prior to it being driven, and to apply voltage to the stress-applying piezoelectric thick-film in this state so as to impart deformation to the substrate 10. In this case, by adjusting the amount of plastic deformation of the substrate 10 in advance prior to voltage being applied, it is possible to adjust the range of change in the resonance frequency f to the optimum range for the applied voltage value. In actual usage, this has the advantage of making it easy to adjust the entire system. Moreover, it is of course possible for this technique to be applied to all of the resonance frequency adjustment methods described in the invention.

In the temperature dependency of the scan angle θ which is evident from the various experiment results, as shown, for example, in FIG. 6, even if the drive frequency is adjusted so as to match a decrease in the resonance frequency f, then if a width Lh of the cantilever beam portions 14 which form a portion of the substrate 10 of the optical scanning device and which support the torsion bar portions 12 to which the mirror portion 11 is connected relative to a width Lw of the substrate 10 of the optical scanning device is set at a large ratio, namely, such that Lh/Lw is greater than or equal to ⅙, then instead of a monotonic increase, a decrease starts from approximately 40° C. to 50° C. (see the right side of FIG. 6). In contrast to this, if Lh/Lw is set at a small ratio, namely, at less than or equal to ⅙, then although there is a slight monotonic increase in the scan angle θ, the change therein is kept to a minimum (see the left side of FIG. 6). Accordingly, if the above-described optical scanning device is designed such that a ratio Lh/Lw of a width Lh of the cantilever beam portions 14 which form a portion of the substrate 10 of the optical scanning device and which support the torsion bar portions 12 to which the mirror portion 11 is connected relative to a width Lw of the substrate 10 is set to Lh/Lw being less than or equal to ⅙, then it becomes possible to perform temperature compensation easily, and it is possible to provide an optical scanning device which has a stable scan angle over a broader temperature range.

Moreover, as shown in FIG. 7, from the various experiment results it is clear that if a ratio w/t between a thickness t and a width w of a cross section of the torsion bar portions 12 to which the mirror portion 11 is connected is greater than or equal to 1.5, then instead of a monotonic increase, the scan angle θ starts to decrease from approximately 40° C. to 50° C. in conjunction with a rise in the surrounding environmental temperature. In contrast to this, if the ratio w/t is less than or equal to 1.5, then although there is a slight monotonic increase in the scan angle θ, the change therein is kept to a minimum. Accordingly, if the above-described optical scanning device is designed such that the ratio w/t between the thickness t and the width w of a cross section of the torsion bar portions 12 to which the mirror portion 11 is connected is less than or equal to 1.5, then it becomes possible to perform temperature compensation easily, and it is possible to provide an optical scanning device which has a stable scan angle over a broader temperature range.

Moreover, as shown in FIG. 8, from the various experiment results it is clear that if a length L1 between the connection portions where the cantilever beam portions 14 which form a portion of the substrate 10 of an optical scanning device and which support the torsion bar portions 12 to which the mirror portion 11 is connected are connected to the torsion bar portions 12 and the open end portion is made shorter than the length L2 between the connection portions where the cantilever beam portions 14 are connected to the torsion bar portions 12 and the fixed ends where the cantilever beam portions 14 are joined to the substrate 10 of the optical scanning device, namely, if L1>L2, then instead of a monotonic increase, the scan angle θ starts to decrease from approximately 40° C. to 50° C. in conjunction with a rise in the surrounding environmental temperature. In contrast to this, if a length between the connection portions where the cantilever beam portions 14 which form a portion of the substrate 10 of an optical scanning device and which support the torsion bar portions 12 to which the mirror portion 11 is connected are connected to the torsion bar portions 12 and the open end portion is made shorter than the length between the connection portions where the cantilever beam portions 14 are connected to the torsion bar portions 12 and the fixed ends where the cantilever beam portions 14 are joined to the substrate 10 of the optical scanning device, namely, if L1>L2, then although there is a slight monotonic increase in the scan angle θ, the change therein is kept to a minimum. Accordingly, if the substrate 10 is designed such that the length L1 between the connection portions where the cantilever beam portions 14 which form a portion of the substrate 10 of an optical scanning device and which support the torsion bar portions 12 to which the mirror portion 11 is connected are connected to the torsion bar portions 12 and the open end portion is made shorter than the length L2 between the connection portions where the cantilever beam portions 14 are connected to the torsion bar portions 12 and the fixed ends where the cantilever beam portions 14 are joined to the substrate 10 of the optical scanning device, namely, if the substrate 10 is designed such that L1>L2, then it becomes possible to perform temperature compensation easily, and it is possible to provide an optical scanning device which has a stable scan angle over a broader temperature range.

Figure 20A:
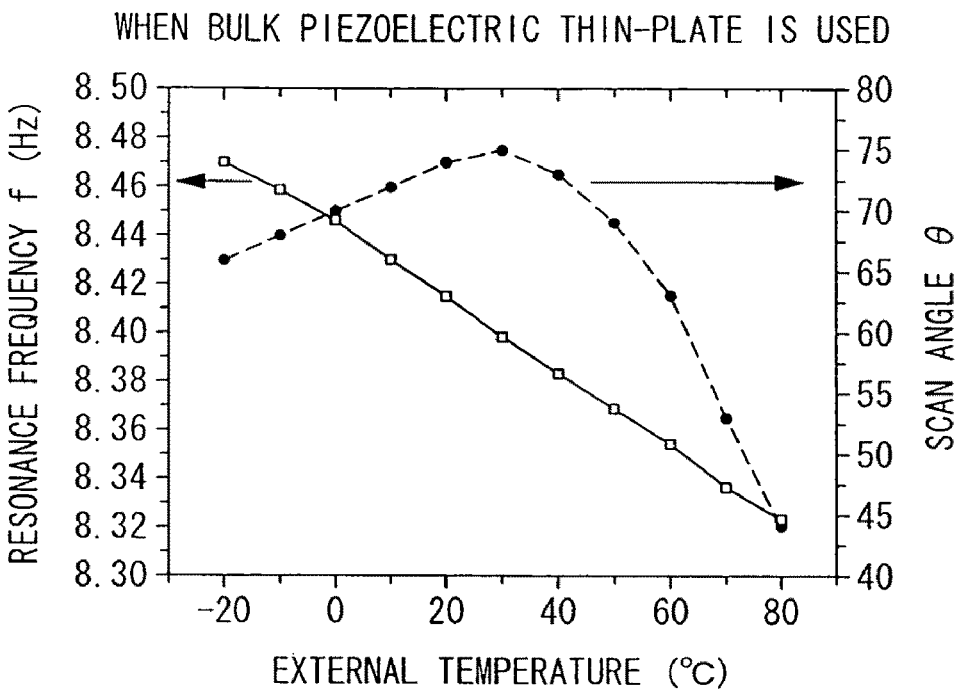
FIG. 20A is a view showing experiment results for a scan angle θ and a resonance frequency f when a thin plate manufactured from an ordinary bulk material is adhered as a piezoelectric component for forming a drive source.
Figure 20B:
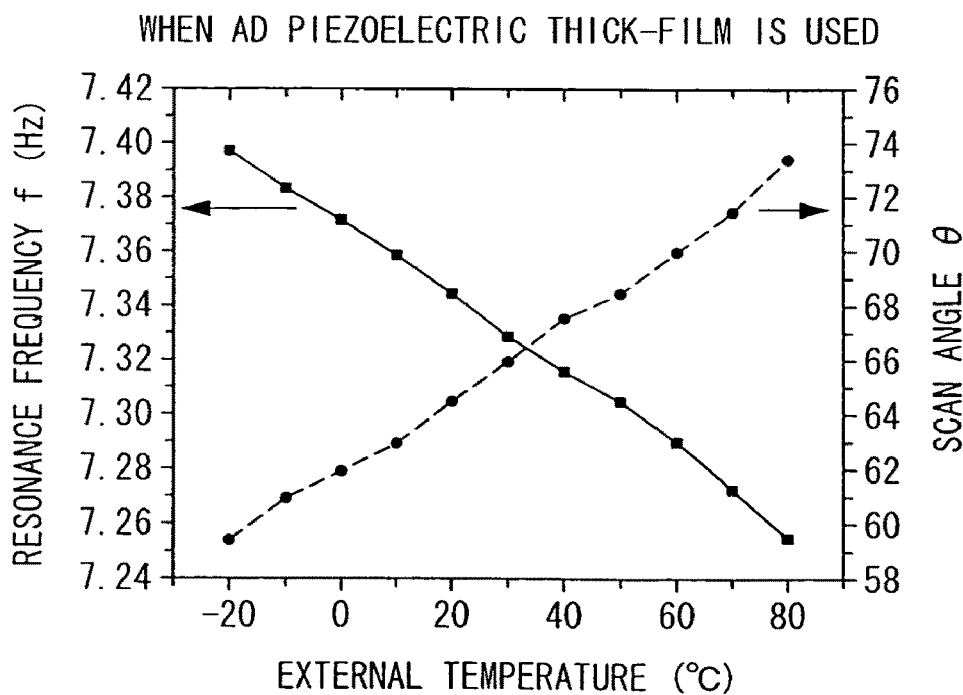
FIG. 20B is a view showing experiment results for a scan angle θ and a resonance frequency f when a piezoelectric film formed using an aerosol deposition (AD) method is adhered as a piezoelectric component for forming a drive source.
Figure 21:
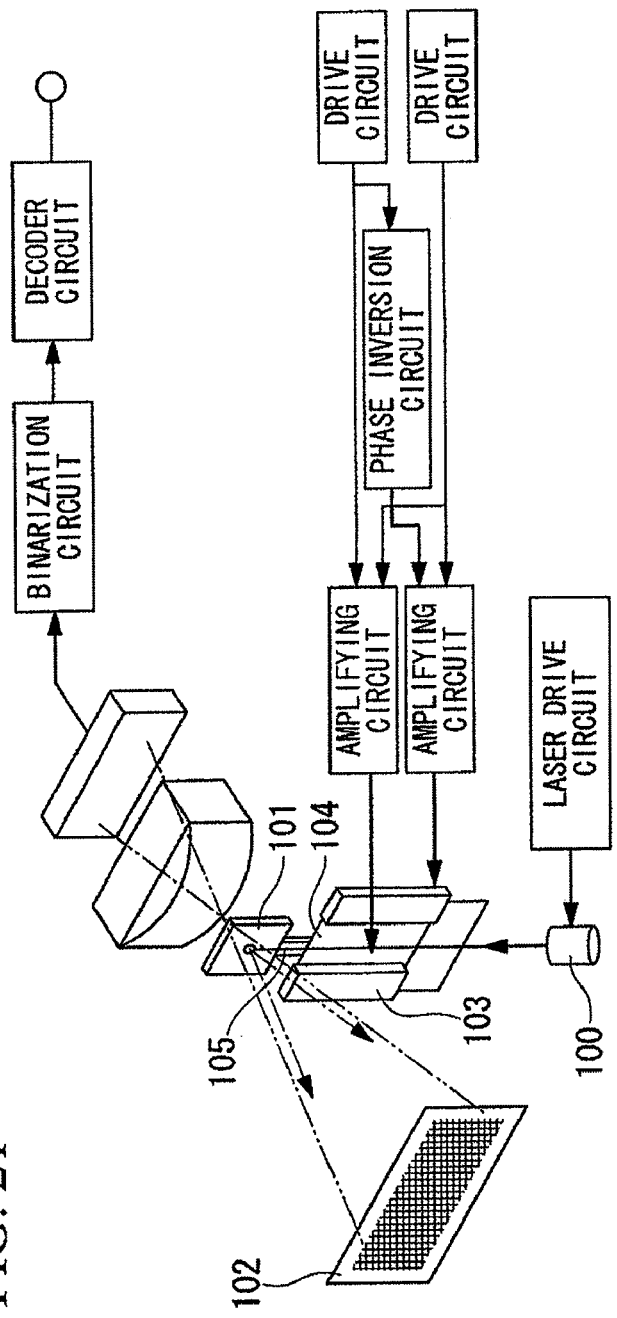
FIG. 21 is a schematic view illustrating Conventional technology 1.
Figure 22:
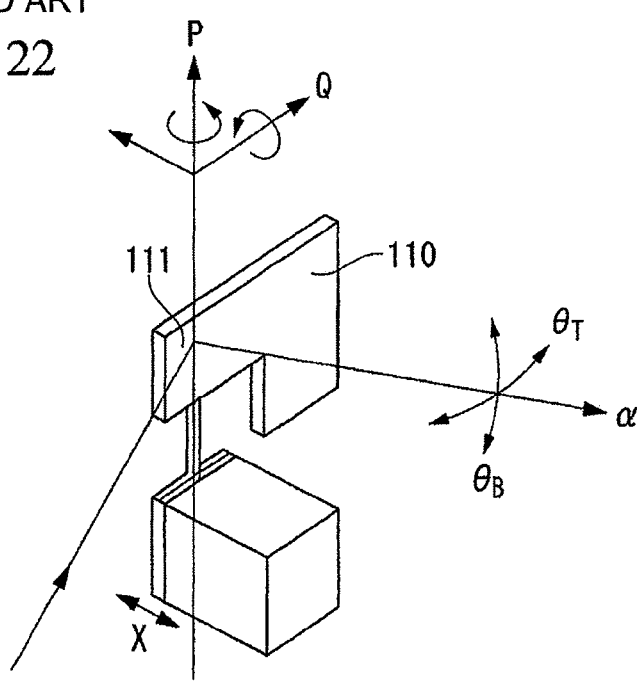
FIG. 22 is a schematic view illustrating Conventional technology 2.
Figure 23:
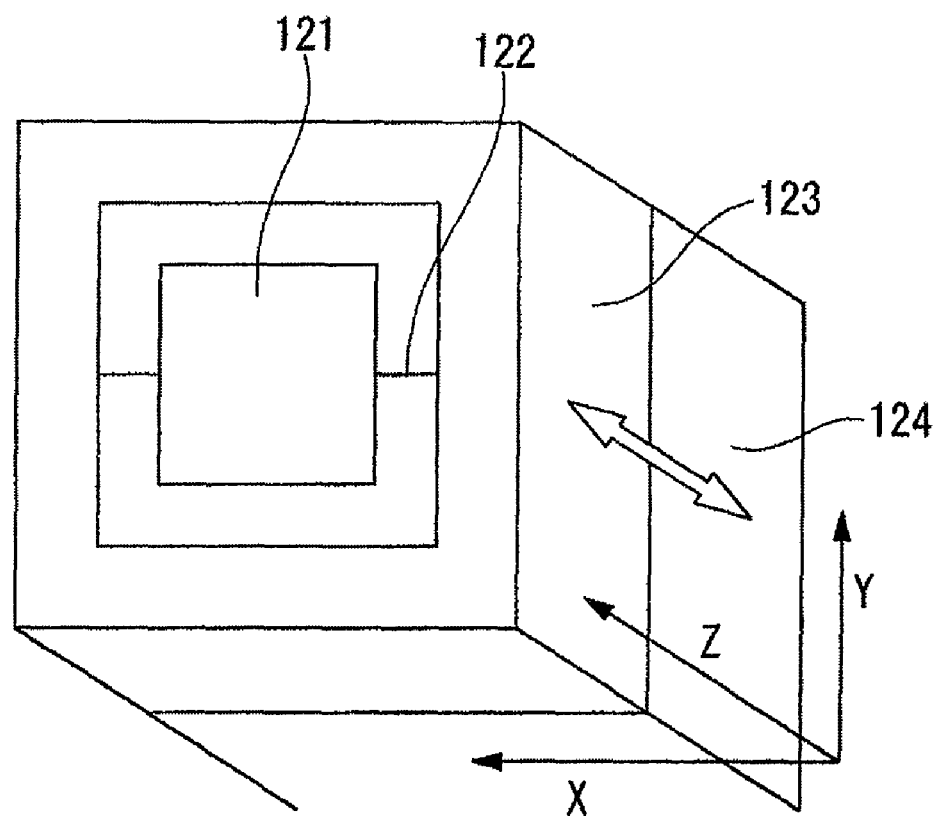
FIG. 23 is a schematic view illustrating Conventional technology 3.
Figure 24:
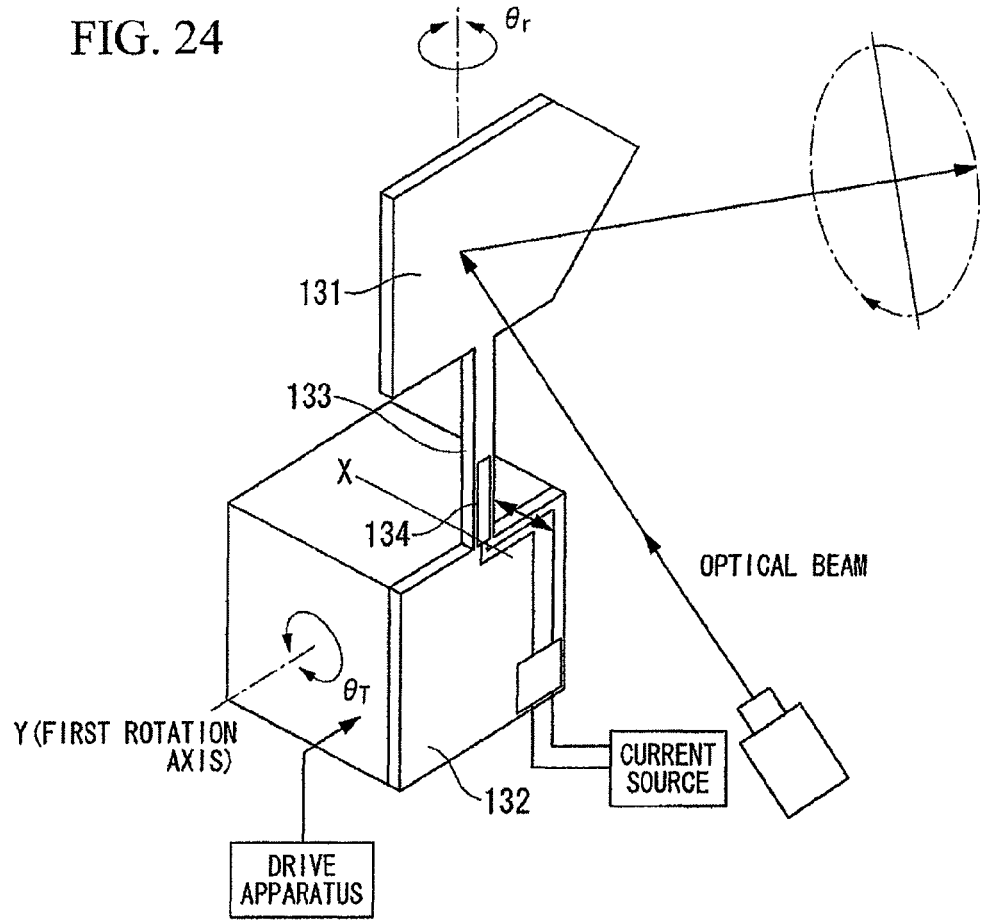
FIG. 24 is a schematic view illustrating Conventional technology 4.
Figure 25:
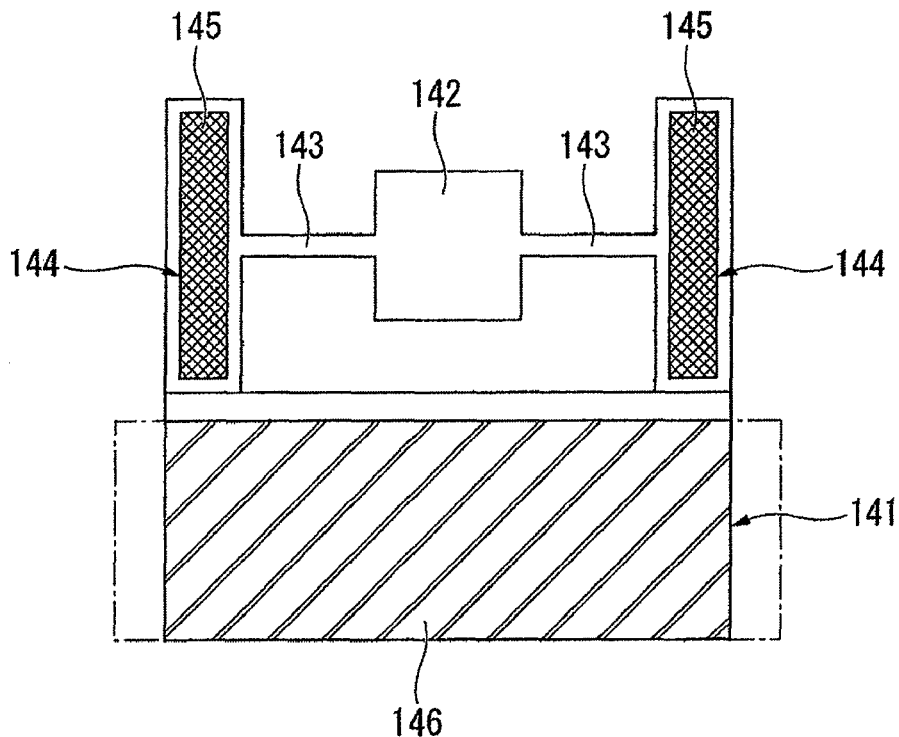
FIG. 25 is a schematic view illustrating Conventional technology 5.
Figure 26:
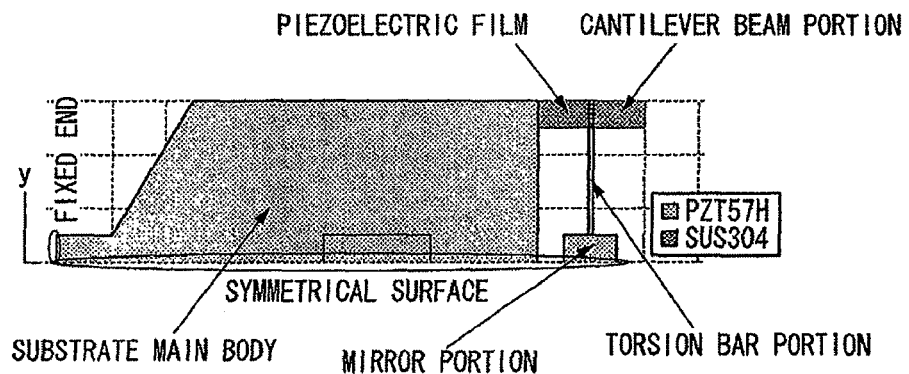
FIG. 26 shows the sane type of structure as in the case of Conventional technology 5, with a surface where Y=0 being taken as a plane of symmetry, and with half of this being used as a model.
Figure 27:
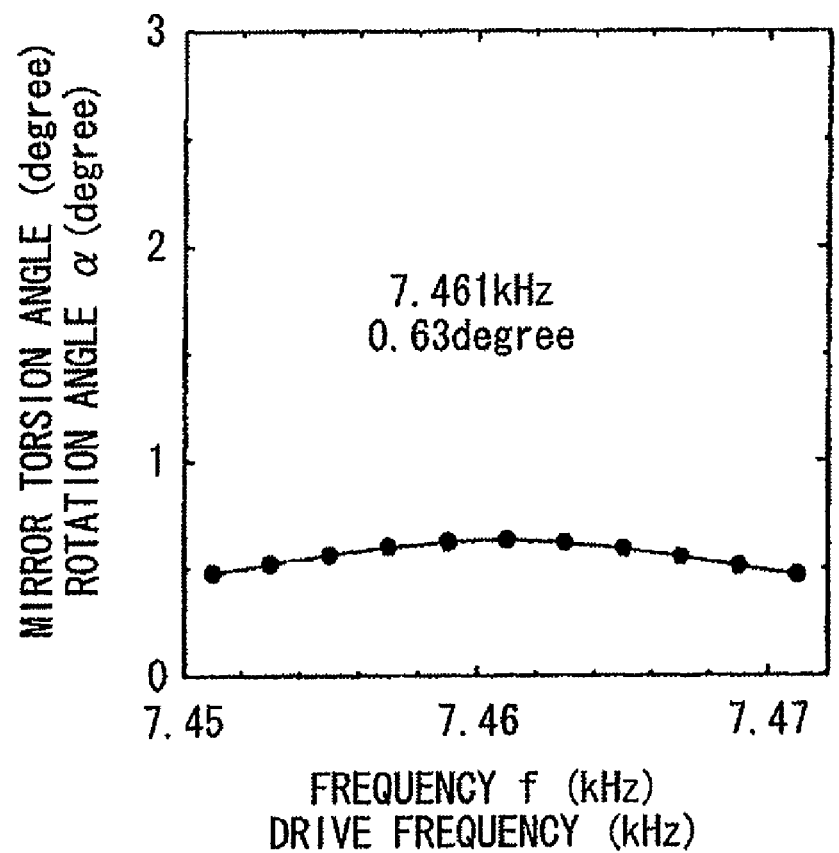
FIG. 27 is a view showing a torsion angle of a mirror portion of a device having the structure shown in FIG. 26.

As shown in FIG. 20A, in the above-described optical scanning devices, when the vibration source which causes the mirror portion 11 to resonate and the piezoelectric component forming the drive source 15 which causes the substrate 10 to deform in order to control the above-described resonance frequency are obtained by adhering a thin plate manufactured from an ordinary bulk material onto a substrate, then, instead of a monotonic increase, the scan angle θ starts to decrease from approximately 40° C. to 50° C. in conjunction with a rise in the surrounding environmental temperature. In contrast to this, as shown in FIG. 20B, if a piezoelectric film which is formed by means of an aerosol deposition (AD) method is used, then the scan angle θ changes in a monotonic increase in response to the temperature variation, and the variation width can also be made smaller, so that it becomes possible to perform temperature compensation easily, and it is possible to provide an optical scanning device which has a stable scan angle over a broader temperature range.

What is claimed is:

1. An optical scanning device, comprising:
a substrate;
a torsion bar portion which is connected to the substrate;
a mirror portion which is supported by the torsion bar portion;
a drive source which causes the substrate to oscillate; and
a light source which projects light onto the mirror portion,
wherein the mirror portion resonates and vibrates in accordance with a vibration imparted to the substrate by the drive source, and a direction of reflection light from the light projected onto the mirror portion from the light source changes in accordance with the vibration of the mirror portion, and
wherein the drive source is provided on a portion of the substrate at a distance from a connected portion where the substrate is connected to the torsion bar portion, and a substrate shape control device which controls the shape of the substrate itself is provided on the substrate.

2. The optical scanning device according to claim 1, wherein the substrate shape control device is configured by providing a stress-applying piezoelectric film on a portion of the substrate.

3. The optical scanning device according to claim 1, wherein the substrate shape control device is configured by one of forming the substrate from a magnetic material and forming the substrate by providing a magnetic material on the substrate.

4. The optical scanning device according to claim 1, wherein the substrate shape control device is configured by superimposing a DC bias signal which is generated by a frequency adjustment signal circuit on an optical scan drive signal generating circuit of the drive source which causes the substrate to vibrate.

5. The optical scanning device according to claim 1, wherein the substrate shape control device is configured by providing a frequency adjustment shape memory alloy on a portion of the substrate.

6. The optical scanning device according to claim 1, wherein the substrate shape control device is configured by providing a film of a frequency adjustment low thermal expansion material on a portion of the substrate.

7. The optical scanning device according to claim 1, wherein the substrate shape control device is configured by one of providing a shape memory alloy thin-plate and providing a bimetal structural component on a cantilever beam portion supporting the torsion bar portion.

8. The optical scanning device according to claim 1, wherein a resonance frequency of the mirror portion, which is determined by a weight of the mirror portion and a spring constant of the torsion bar portion, is set away from a resonance frequency of the substrate.

9. The optical scanning device according to claim 1, wherein a substrate fixing frame is positioned so as to surround a substrate main body and a cantilever beam portion and is fixed to a fixing end portion side of the substrate main body, and the substrate main body and the substrate fixing frame are connected together by substrate connecting bars at a position separated from a supporting component and at a position proximate to a measured minimum amplitude of the substrate vibration.

10. An optical scanning device, comprising:
a substrate;
a torsion bar portion which is connected to the substrate;
a mirror portion which is supported by the torsion bar portion;
a drive source which causes the substrate to oscillate; and
a light source which projects light onto the mirror portion,
wherein the mirror portion resonates and vibrates in accordance with a vibration imparted to the substrate by the drive source, and a direction of reflection light from the light projected onto the mirror portion from the light source changes in accordance with the vibration of the mirror portion,
wherein a width of a cantilever beam portion which supports the torsion bar portion is less than or equal to ⅙ width of the substrate, and
wherein a resonance frequency of the mirror portion, which is determined by a weight of the mirror portion and a spring constant of the torsion bar portion, is set away from a resonance frequency of the substrate.

11. An optical scanning device, comprising:
a substrate;
a torsion bar portion which is connected to the substrate;
a mirror portion which is supported by the torsion bar portion;
a drive source which causes the substrate to oscillate; and
a light source which projects light onto the mirror portion,
wherein the mirror portion resonates and vibrates in accordance with a vibration imparted to the substrate by the drive source, and a direction of reflection light from the light projected onto the mirror portion from the light source changes in accordance with the vibration of the mirror portion,
wherein a width of a cantilever beam portion which supports the torsion bar portion is less than or equal to ⅙ width of the substrate, and
wherein a substrate fixing frame is positioned so as to surround a substrate main body and the cantilever beam portion and is fixed to a fixing end portion side of the substrate main body, and the substrate main body and the substrate fixing frame are connected together by substrate connecting bars at a position separated from a supporting component and at a position proximate to a measured minimum amplitude of the substrate vibration.

12. An optical scanning device, comprising:
a substrate;
a torsion bar portion which is connected to the substrate;
a mirror portion which is supported by the torsion bar portion;
a drive source which causes the substrate to oscillate; and
a light source which projects light onto the mirror portion,
wherein the mirror portion resonates and vibrates in accordance with a vibration imparted to the substrate by the drive source and a direction of reflection light from the light projected onto the mirror portion from the light source changes in accordance with the vibration of the mirror portion,
wherein a length between a connection portion where a cantilever beam portion which supports the torsion bar portion is connected to the torsion bar portion and an open end portion is made shorter than a length between a connection portion where the cantilever beam portion is connected to the torsion bar portion and a fixed end of the cantilever beam portion, and
wherein a resonance frequency of the mirror portion, which is determined by a weight of the mirror portion and a spring constant of the torsion bar portion, is set away from a resonance frequency of the substrate.

13. An optical scanning device comprising:
a substrate;
a torsion bar portion which is connected to the substrate;

a mirror portion which is supported by the torsion bar portion;

a drive source which causes the substrate to oscillate; and a light source which projects light onto the mirror portion, wherein the mirror portion resonates and vibrates in accordance with a vibration imparted to the substrate by the drive source and a direction of reflection light from the light projected onto the mirror portion from the light source changes in accordance with the vibration of the mirror portion, wherein a length between a connection portion where a cantilever beam portion which supports the torsion bar portion is connected to the torsion bar portion and an open end portion is made shorter than a length between a connection portion where the cantilever beam portion is connected to the torsion bar portion and a fixed end of the cantilever beam portion, and wherein a substrate fixing frame is positioned so as to surround a substrate main body and the cantilever beam portion and is fixed to a fixing end portion side of the substrate main body, and the substrate main body and the substrate fixing frame are connected together by substrate connecting bars at a position separated from a supporting component and at a position proximate to a measured minimum amplitude of the substrate vibration.

14. An optical scanning device comprising:

a substrate;

a torsion bar portion which is connected to the substrate;

a mirror portion which is supported by the torsion bar portion;

a drive source which causes the substrate to oscillate; and a light source which projects light onto the mirror portion, wherein the mirror portion resonates and vibrates in accordance with a vibration imparted to the substrate by the drive source and a direction of reflection light from the light projected onto the mirror portion from the light source changes in accordance with the vibration of the mirror portion, wherein a ratio (w/t) between a thickness t and a width w of a cross section of the torsion bar portion is less than or equal to 1.5, and wherein a resonance frequency of the mirror portion, which is determined by a weight of the mirror portion and a spring constant of the torsion bar portion, is set away from a resonance frequency of the substrate.

15. An optical scanning device comprising:

a substrate;

a torsion bar portion which is connected to the substrate;

a mirror portion which is supported by the torsion bar portion;

a drive source which causes the substrate to oscillate; and a light source which projects light onto the mirror portion, wherein the mirror portion resonates and vibrates in accordance with a vibration imparted to the substrate by the drive source, and a direction of reflection light from the light projected onto the mirror portion from the light source changes in accordance with the vibration of the mirror portion, wherein a ratio (w/t) between a thickness t and a width w of a cross section of the torsion bar portion is less than or equal to 1.5, and wherein a substrate fixing frame is positioned so as to surround a substrate main body and a cantilever beam portion and is fixed to a fixing end portion side of the substrate main body, and the substrate main body and the substrate fixing frame are connected together by substrate connecting bars at a position separated from a supporting component and at a position proximate to a measured minimum amplitude of the substrate vibration.

* * * * *